US011862724B1

US 11,862,724 B1

(12) United States Patent
Hamlyn

(10) Patent No.: US 11,862,724 B1
(45) Date of Patent: Jan. 2, 2024

(54) DEVICES AND METHODS FOR COMPACT RADIATION-HARDENED INTEGRATED CIRCUITS

(71) Applicant: Apogee Semiconductor, Inc., Plano, TX (US)

(72) Inventor: Mark Hamlyn, Murphy, TX (US)

(73) Assignee: Apogee Semiconductor, Inc., Plano, TX (US)

( * ) Notice: Subject to any disclaimer, the term of this patent is extended or adjusted under 35 U.S.C. 154(b) by 0 days.

(21) Appl. No.: 18/460,138

(22) Filed: Sep. 1, 2023

Related U.S. Application Data

(62) Division of application No. 18/163,692, filed on Feb. 2, 2023, now Pat. No. 11,784,250.

(51) Int. Cl.
| | | |
|---|---|---|
| *H01L 29/78* | (2006.01) | |
| *H01L 29/66* | (2006.01) | |
| *H01L 27/092* | (2006.01) | |
| *H01L 29/10* | (2006.01) | |
| *H01L 21/8238* | (2006.01) | |

(52) U.S. Cl.
CPC .. *H01L 29/7833* (2013.01); *H01L 21/823814* (2013.01); *H01L 27/092* (2013.01); *H01L 29/1083* (2013.01); *H01L 29/6659* (2013.01)

(58) Field of Classification Search
None
See application file for complete search history.

(56) References Cited

U.S. PATENT DOCUMENTS

| 4,054,894 A | 10/1977 | Heagerty et al. |
| 4,591,890 A | 5/1986 | Lund et al. |
| 5,220,192 A | 6/1993 | Owens et al. |

(Continued)

OTHER PUBLICATIONS

Hatano et al., Radiation-tolerant high-performance CMOS VLSI circuit design, IEEE Transactions on Nuclear Science, vol. NS-32, No. 6, Dec. 1985, pp. 4031-4035.

(Continued)

*Primary Examiner* — Joseph C. Nicely
*Assistant Examiner* — Lamont B Koo
(74) *Attorney, Agent, or Firm* — Gregory A. Magel

(57) ABSTRACT

Compact radiation-hardened NMOS transistors permitting close spacing for high circuit density can be fabricated using modern commercial foundry processes incorporating lightly-doped drain (LDD) and silicidation techniques. Radiation-induced leakage currents in parasitic field oxide transistors are reduced by spacing diffusions away from field oxide edges under the gate, forming gap regions from which n-type dopants and silicide formation are excluded using blocking patterns in the layout. P-type implants along these field oxide edges further increase radiation tolerance. Dimensions can be tailored to permit tradeoffs between radiation tolerance, breakdown voltage, and circuit density. Compact layouts for series-connected NMOS transistors are provided and applied to high-density rad-hard circuits. Methods for fabricating devices having these features are also provided, requiring minimal adaptation of standard processes. These designs and processes allow a mix of integrated circuits having differing levels of tolerance to total ionizing dose on the same semiconductor wafer.

15 Claims, 13 Drawing Sheets

(56) References Cited

U.S. PATENT DOCUMENTS

| | | | |
|---|---|---|---|
| 5,915,182 A * | 6/1999 | Wu | H01L 29/4983 |
| | | | 257/E21.151 |
| 6,054,367 A | 4/2000 | Groves et al. | |
| 6,847,065 B1 | 1/2005 | Lum | |
| 7,304,354 B2 | 12/2007 | Morris | |
| 7,518,218 B2 | 4/2009 | Gardner | |
| 7,906,805 B2 | 3/2011 | Sadd et al. | |
| 8,995,162 B2 | 3/2015 | Sang et al. | |
| 2011/0084324 A1 | 4/2011 | Donnelly et al. | |
| 2020/0090981 A1 | 3/2020 | Donnelly | |

OTHER PUBLICATIONS

Hatano et al., Total dose radiation-hardened latch-up free CMOS structures for radiation-tolerant VLSI designs, IEEE Transactions on Nuclear Science, vol. NS-33, No. 6, Dec. 1986, pp. 1505-1509.
Shaneyfelt et al., Challenges in hardening technologies using shallow-trench isolation, IEEE Transactions on Nuclear Science, vol. 45, 1998, pp. 2584-2592.
Mayer et al., Reliability Enhancement in High-Performance MOSFETs by Annular Transistor Design, IEEE Transactions on Nuclear Science, vol. 51, No. 6, Dec. 2004, pp. 3615-3620.

* cited by examiner

DEVICES AND METHODS FOR COMPACT RADIATION-HARDENED INTEGRATED CIRCUITS

This application is a divisional of application Ser. No. 18/163,692, filed Feb. 2, 2023.

BACKGROUND OF THE INVENTION

1. Field of the Invention

This invention is directed to the field of semiconductor devices, and more particularly, to designs and methods of fabrication for devices and integrated circuits having improved hardness to total ionizing radiation dose.

2. Description of the Related Art

Transistor devices and integrated circuits (ICs) are known to be susceptible to ionizing radiation. Ionizing radiation is made of energetic subatomic particles, ions, or atoms moving at high speeds, and high-energy electromagnetic radiation such as gamma rays and X-rays, and is especially prevalent in space, in nuclear power plants, in high-energy physics experiments, or in the vicinity of a nuclear explosion. Besides in aerospace, military, and research applications, ICs may also encounter ionizing radiation in medical imaging and other commercial applications. When an MOS device is exposed to ionizing radiation, electron-hole pairs are generated in the various oxide regions, resulting in trapped charge and interface states. The result is a cumulative buildup of positive charge in the oxide due to the Total Ionizing Dose (TID), leading to large negative threshold shifts, and thus to current leakage, particularly in n-type MOS (NMOS) transistors and parasitic devices associated with them. This TID-induced leakage leads at least to increased power dissipation, and can even lead to an operational failure of an integrated circuit (IC) device that incorporates the NMOS transistor.

Although susceptibility to TID can be reduced using special radiation-hardened ("rad-hard") IC fabrication processes, specialized device design and layout techniques are available to improve radiation hardness ("Rad-Hard by Design" or RHBD), without requiring a special rad-hard process, thereby permitting the use of advanced commercial CMOS process nodes. These design techniques enable ICs that combine both rad-hard devices in critical circuit locations and non-rad-hard devices that can be more compact and higher performance, in order to simultaneously optimize radiation tolerance, circuit performance, and circuit density.

To illustrate some of the issues to be addressed, refer now to FIG. 1A, showing a simplified plan-view layout of an example of a basic prior art low-voltage NMOS transistor 100. A linear gate 106 of length L crosses a rectangular active region surrounded by field oxide and defined by ACTIVE mask pattern 102, within which field oxide is not formed, but instead where a thin gate oxide underlies the (typically polysilicon) gate 106. NSD pattern 108 is generally coincident in the prior art with ACTIVE 102 in areas where a transistor 100 is to be fabricated. NSD pattern 108 is used for implanting N+ source and drain areas 110a and 110b into the opening of the ACTIVE 102, which are conventionally referred to as "diffusions" (these areas are functionally identical until they are connected in a circuit, after which the area driven at a lower voltage is conventionally defined to be the source). The electrical width of the transistor is determined by the width W of the diffusions 110a and 110b next to the gate 106. The direction of transistor structures substantially parallel to the gate length L is referred to herein as being along the "length direction," while structures along the width W are referred to as being along the "width direction."

Some of the most troublesome leakage paths that can be induced by radiation are in NMOS transistors, caused by parasitic edge transistors that form in the length direction along the edges of the field oxide in the opening defined by ACTIVE pattern 102 where they cross under gate electrode 106, as shown by the curved arrows 120 on the left and right sides of FIG. 1A. Ionizing radiation induces the formation of persistent trapped positive charges that build up in oxides, and these charges result in the formation of parasitic edge channels of approximate length L that leak under gate 106 along these thick edges of ACTIVE 102. With increasing TID, the threshold voltage of the depletion-mode parasitic edge transistors decreases, and these shifts in threshold voltage cause excessive leakage current to flow when the gate is biased. Alternative transistor designs such as annular "edgeless" transistors have sometimes been used to eliminate the edge leakage paths found in standard linear-gate NMOS transistors, but many such transistor designs do not scale well to the smaller transistor sizes used in more advanced CMOS technologies. Leakage can also occur under the field oxide between transistors, and between NSD diffusions and N-wells, and such leakage can be reduced using guard rings and channel stops. Layout techniques helping to minimize the size and spacing of guard rings are also needed to improve the circuit density of rad-hard designs.

One layout technique that has been used to mitigate the effects of parasitic edge transistors is shown in FIG. 1B, which is a schematic plan view or mask layout depicting a prior art NMOS transistor 150 with a rectangular active region defined by an ACTIVE pattern 152 describing a rectangular boundary having a total length H and total width A, within which there is no field oxide. (Henceforth, it will be understood that a boundary of a mask pattern in a layout and a corresponding device structure or region defined by that mask pattern may be referred to interchangeably by the same reference numeral for brevity and clarity, for example, "ACTIVE pattern 152," "ACTIVE 152," and "active region 152.") The NMOS transistor is formed in a lightly-doped p-type substrate, surface layer, or well. An n-type diffusion region comprising heavily-doped n-type source/drain portions 160a and 160b is defined by NSD mask pattern 158, which is also rectangular, but having a width W that is narrower than active width A. As will be understood by those skilled in the art, implantation of a high concentration of n-type dopants into the region defined by the border of NSD 158 (the NSD implant) defines an n-type diffusion region of width W and length H in this example, and the material of gate 156 (typically polysilicon) blocks this implantation so as to divide this diffusion region into two unconnected portions 160a and 160b on either side of gate 156, which portions may act either as a source or a drain of the NMOS transistor, depending on the voltages applied and functional connections to other circuit elements. Using gate 156 to block the NSD implant results in self-alignment of portions 160a and 160b of the diffusion region to gate 156, as is well known in the art. Portions such as 160a and 160b of an n-type diffusion region are sometimes themselves referred to as "diffusion regions" by those skilled in the art. The electrical width of the transistor is determined by the widths of the source/drain diffusion regions 160a and 160b at the "sidewalls" 156a and 156b of gate pattern 156. In order to prevent field oxide leakage under the NMOS gate edges where they cross over the boundary of ACTIVE 152, the diffusion width W has been reduced by displacing each of the left edge 158a and right edge 158b of NSD 158 inward toward the center of the active region by a "gap width" g from the respective left edge 152a and right edge 152b of ACTIVE 152. [HATANO et al., Radiation-tolerant high-performance CMOS VLSI circuit design, IEEE Transactions on Nuclear Science, Vol. NS-32, No. 6, December 1985, pp. 4031-4035.] The same gap width g may be used on both sides of the transistor, as shown. Displacing edges 158a and 158b inward from edges 152a and 152b removes the source/drain regions 160a and 160b from proximity with the field oxide edges, forming gap region(s) 154 (indicated using a sparse random stipple pattern) and increasing the threshold voltage of parasitic edge transistors that can form along those edges. Note that gap region 154 is not simply-connected, but is divided into several portions or "gap regions" 154 bounded by GATE 156, ACTIVE 152, and a border of NSD 158. This displacement of a segment of NSD 158 with respect to a boundary of ACTIVE 152 is sometimes referred to as being "pulled back."

The design of transistor 150 in FIG. 1B was introduced for use with a LOCal Oxidation of Silicon (LOCOS) process using an older field oxide isolation technology that was useful for technology nodes having minimum feature sizes down to approximately 250 nm. More modern IC processes at 180 nm and below often use different isolation technologies such as Shallow Trench Isolation (STI), and have necessarily introduced additional structures and features to compensate for device nonidealities that arise at smaller dimensions. For example, as ICs are scaled to submicron characteristic dimensions, parasitic resistances increase on both gates and source-drain regions. Metal silicides, including compounds of tungsten (W), titanium (Ti), nickel (Ni), cobalt (Co), platinum (Pt), palladium (Pd), molybdenum (Mo), and tantalum (Ta), have been incorporated into submicron IC processes such as those using STI to increase the conductivity of polysilicon gates, and to reduce the sheet resistance of silicon source/drain regions as well as to improve their contact resistance to metal. Silicides (sometimes called "polycide" on the polysilicon gate and "salicide" for "Self-Aligned siLICIDE" on the source and drain) are most commonly formed by depositing a refractory metal onto exposed silicon and performing an anneal to react the metal with the silicon to form a metal silicide, although sputtering or chemical vapor deposition (CVD) techniques are possible for some of the compounds. Both process and layout techniques require adaptation in order to successfully integrate silicide into an IC, and rad-hard layout techniques are needed that comprehend the existence of the silicide layer in the process.

Also, as gate lengths and channel lengths decrease in advanced nodes, transistor devices are increasingly susceptible to hot carrier effects and other short-channel effects (SCEs) that adversely affect transistor performance. Source/drain extensions (SDE)—formed using a variety of lightly-doped drain (LDD) techniques and also known as lightly-doped drains (LDD)—may be created to extend the source/drain toward each other (reducing channel length), and grade the depth and concentration of n-type dopants to reduce channel hot carriers, and to reduce other short-channel effects such as drain-induced barrier lowering (DIBL) and subsurface punch-through. LDD structures use low-energy implants of the same dopant type as the source and drain 160a and 160b along and under the sidewalls 156a and 156b of gate 156, and can be created using a variety of process techniques that can involve the formation of oxide gate sidewall spacers before or after an LDD implant. Although typically created on both source and drain sides 156a and 156b of gate 156, they are commonly referred to simply as lightly-doped drain (LDD) regions. These techniques are also applied to PMOS transistors; however, the present invention focuses on NMOS transistors since they are more susceptible to TID-induced leakage. N-type LDD structures for use in NMOS transistors may be created using a dedicated NLDD pattern mask or sometimes using the NSD 158 pattern. Rad-hard layout techniques are also needed that comprehend the existence of n-type LDD doping along the gate in the process.

There thus remains a need for designs of radiation-hardened MOS devices that enable rad-hard integrated circuits having improved circuit density, that can be fabricated using a modern commercial IC process together with non-rad-hard devices, while requiring minimal adaptation of the process.

SUMMARY OF THE INVENTION

The present invention has been made to solve the aforementioned problems, and accordingly it is an object of this invention to provide compact layouts for transistors having enhanced tolerance to Total Ionizing Dose, resulting in high-density radiation-hardened integrated circuits that can be produced using an advanced process incorporating lightly-doped drain (LDD) and silicidation techniques.

It is another object of the present invention to provide the capability to tailor a transistor design permitting tradeoffs between radiation tolerance, device performance, and circuit density, and to allow devices and integrated circuits having differing levels of these parameters to be fabricated on the same semiconductor wafer.

It is yet another object of the present invention to provide compact layouts combining multiple transistors that can be used to further increase the density of rad-hard IC devices.

It is still another object of the present invention to provide a method of fabricating radiation-hardened devices and/or integrated circuits that have capabilities and advantages as described herein that requires minimal adaptation of a commercial IC process.

These objects are achieved by the present invention, which in some embodiments provides a radiation-hardened NMOS transistor device in which a segment of the border of the n-type source/drain diffusion regions where it crosses the gate is displaced into the active region to create a gap region. The width of the gap region can be increased to increase radiation tolerance for a given channel width at the expense of increased device size in the width direction. Mask layouts are provided in which there is no n-type doping from source/drain diffusions or from lightly-doped drain (LDD) structures along the gate sidewalls in the gap region, and silicide block patterns are also provided in order to prevent silicide formation in the gap region that could otherwise short the n-type diffusion region to the surface of the substrate. Displacing the border of the n-type diffusion region reduces radiation-induced leakage current by raising the threshold voltage of a parasitic field oxide transistor that forms at the edge of the field oxide where it passes under the gate. A moderately-doped p-type band may additionally be formed along the edge of the field oxide under the gate in order to further increase the threshold voltage of the parasitic field oxide transistor. The doping concentration of such a p-type band and the distance it extends into the gap region may be adjusted to achieve a tradeoff between radiation tolerance level and device performance such as breakdown voltage as well as device size, and hence circuit density.

The segment of the border that is displaced into the active region is shorter than the length of the active region, but longer than the gate length, so that its ends are on opposite sides of the gate, and at least one of its ends is separated from the ends of the active region by at least a minimum distance dictated by process design rules. Exemplary embodiments are provided in which the active region is plus-shaped, having tabs extending outward along the gate to form the displacement of the n-type diffusion region from the edge of the field oxide; and alternatively in which segments of the n-type diffusion region crossing the gate are pulled back into the active region to form notches. Separating an end of the segment from an end of the active region in the length direction permits close placement of neighboring devices and substrate contacts on that end, by avoiding design rules that might otherwise be triggered by the structures that are needed to implement the gap region if they were to extend to one or both ends of the active region. Making the displaced segment longer than the gate length also allows the transistor gate to be laid out using a minimum gate length as allowed by process design rules. In some embodiments, adjacent NMOS transistors may share a portion of the n-type diffusion region to create compact radiation-hardened series-connected transistor pairs that may be used in digital logic or analog circuits, examples of which are provided. Embodiments of the present invention enable designs of radiation-hardened circuitry having circuit densities and performance approaching those of non-hardened circuitry.

In another embodiment, a radiation-hardened integrated circuit is provided comprising one or more radiation-hardened NMOS transistors according to the present invention operatively connected to one or more other integrated devices. Embodiments are provided in which a radiation-hardened NMOS device shares a portion of an n-type diffusion region with a second NMOS transistor, which may be either rad-hard or non-rad-hard, in order to form a rad-hard series-connected pair of NMOS transistors. Compact rad-hard digital NAND gates and analog current mirrors are provided as examples of circuits using rad-hard series-connected pairs of NMOS transistors. In some embodiments, radiation-hardened NMOS devices may share an active region in order to provide matching of their electrical characteristics and to achieve high circuit density.

In yet another embodiment, a semiconductor wafer comprising a plurality of integrated circuit dice is provided in which at least one of the dice comprises a radiation-hardened NMOS device. By applying the principles of the present invention, different dice on the wafer may have differing levels of radiation tolerance, or differing tradeoffs between radiation tolerance and performance.

In still another embodiment of the present invention, a method of fabricating a radiation-hardened NMOS device is provided. A silicon substrate is provided having a surface that is lightly doped p-type. A field oxide is formed in the surface of the substrate, and patterned to define an active region within which there is no field oxide. A moderately-doped p-type band may optionally be formed along a field oxide edge that will be under the gate to help reduce parasitic edge leakage. A gate oxide is grown in the active region, and a polysilicon (poly) gate layer is deposited. The gate polysilicon is etched, and source/drain extensions are formed using lightly-doped drain techniques using an LDD pattern that excludes n-type doping from a gap region. Highly doped n-type source/drain diffusion regions (NSD) are patterned so as to exclude the n-type dopant from the gap region, and the device or IC is completed using conventional steps. An optional silicide may be formed after patterning and doping the source/drain diffusion regions, using a silicide block pattern that excludes silicide from forming in the gap region. In some embodiments, the silicide block pattern extends across the gate, and an optional step to dope the poly over a radiation-hardened NMOS device using a REDOPE pattern is provided before patterning and etching the poly. This "redoping" step may be used to increase the conductivity of the gate in regions where silicide will be prevented from forming on the gate due to the silicide block pattern.

Other features and advantages of the present invention will be apparent to those of ordinary skill in the art upon reference to the following detailed description taken in conjunction with the accompanying drawings, which are to be understood to be exemplary and explanatory, and are intended to provide further explanation of the invention as claimed.

DETAILED DESCRIPTION

Figure 1A:
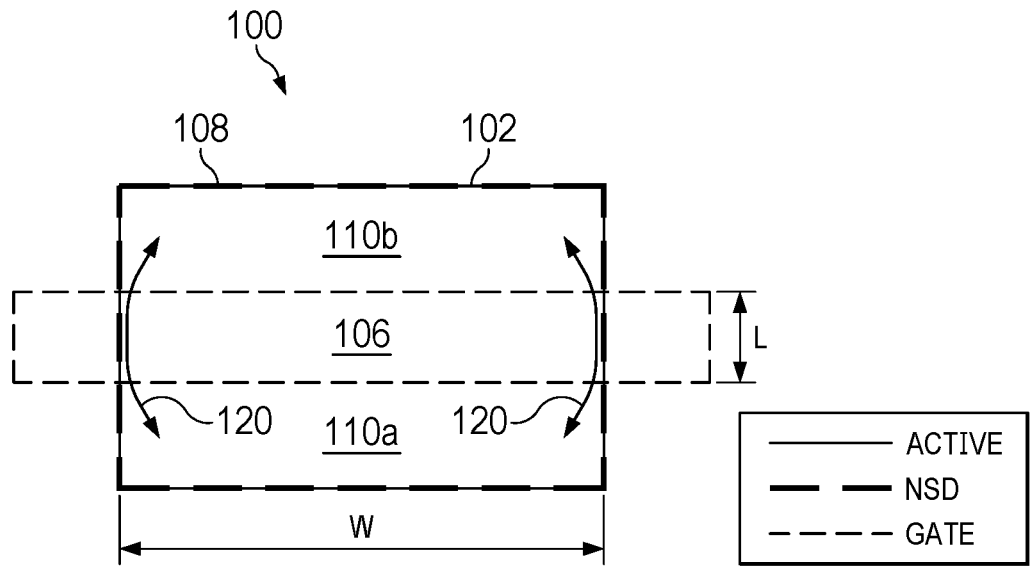
FIG. 1A is a schematic plan view or mask layout of a prior art NMOS transistor showing TID-induced leakage paths.

The following Detailed Description is merely exemplary in nature and is not intended to limit the various embodiments or the application and uses thereof. Furthermore, there is no intention to be bound by any theory presented in the preceding background or the following detailed description. Embodiments of the present disclosure are generally directed to semiconductor devices and integrated circuits, and methods for fabricating the same. Conventional techniques related to integrated circuit device design and fabrication may not be described in full detail herein, and the various tasks and process steps described herein may be incorporated into a more comprehensive procedure or process having additional steps or functionality. In particular, various steps in the manufacture of semiconductor-based integrated circuits are well-known and so, in the interest of brevity, many conventional steps may be mentioned only briefly herein or may be omitted entirely without providing well-known process details. For example, the use of the word "patterned" implies the steps of applying photoresist (resist), exposing the resist to light using a photomask, and developing the resist to create a patterned resist masking layer (note that a layout shape for a mask or reticle is also called a "pattern"), subsequent to which an ion implantation, etching or deposition step may occur through the patterned resist to create a structure having the lateral shape of the exposed and developed resist pattern. Similarly, stripping, removal, ashing, and cleaning steps associated with patterning, deposition, etching, and doping steps that may be required but are well-known are likewise omitted.

Although the present invention is described and illustrated herein with reference to a submicron CMOS process using Shallow Trench Isolation (STI) and self-aligned silicide (salicided) polysilicon and diffusions, it will be apparent to those skilled in the art that the illustrated exemplary techniques and structures for device layouts, and the related integrated circuit processing fabrication methods that will be described herein, may have application to a wide variety of NMOS transistor devices, and to different variations of MOS processes using different isolation technologies such as LOCOS.

Well known in the art are the designations "P−", "P", and "P+" to describe ranges of doping concentrations of p-type dopants, and "N—", "N", and "N+" to describe ranges of doping concentrations of n-type dopants, where "P−" and "N—" refer to doping concentrations of $10^{14}$-$10^{16}$ cm$^{-3}$, "P" and "N" refer to concentrations of $10^{16}$-$10^{19}$ cm$^{-3}$, and "P+" and "N+" refer to concentrations of $10^{19}$-$10^{21}$ cm$^{-3}$. These dopant concentrations can be introduced into the substrate by a number of different processes, but ion implantation will be described herein as an example process capable of placing the dopants precisely where they are required. For a given implant energy, peak volumetric concentrations are approximately proportional to the "dose" of the implant, given in units of cm$^{-2}$, which is a quantity easily specified during processing.

Figure 2A:
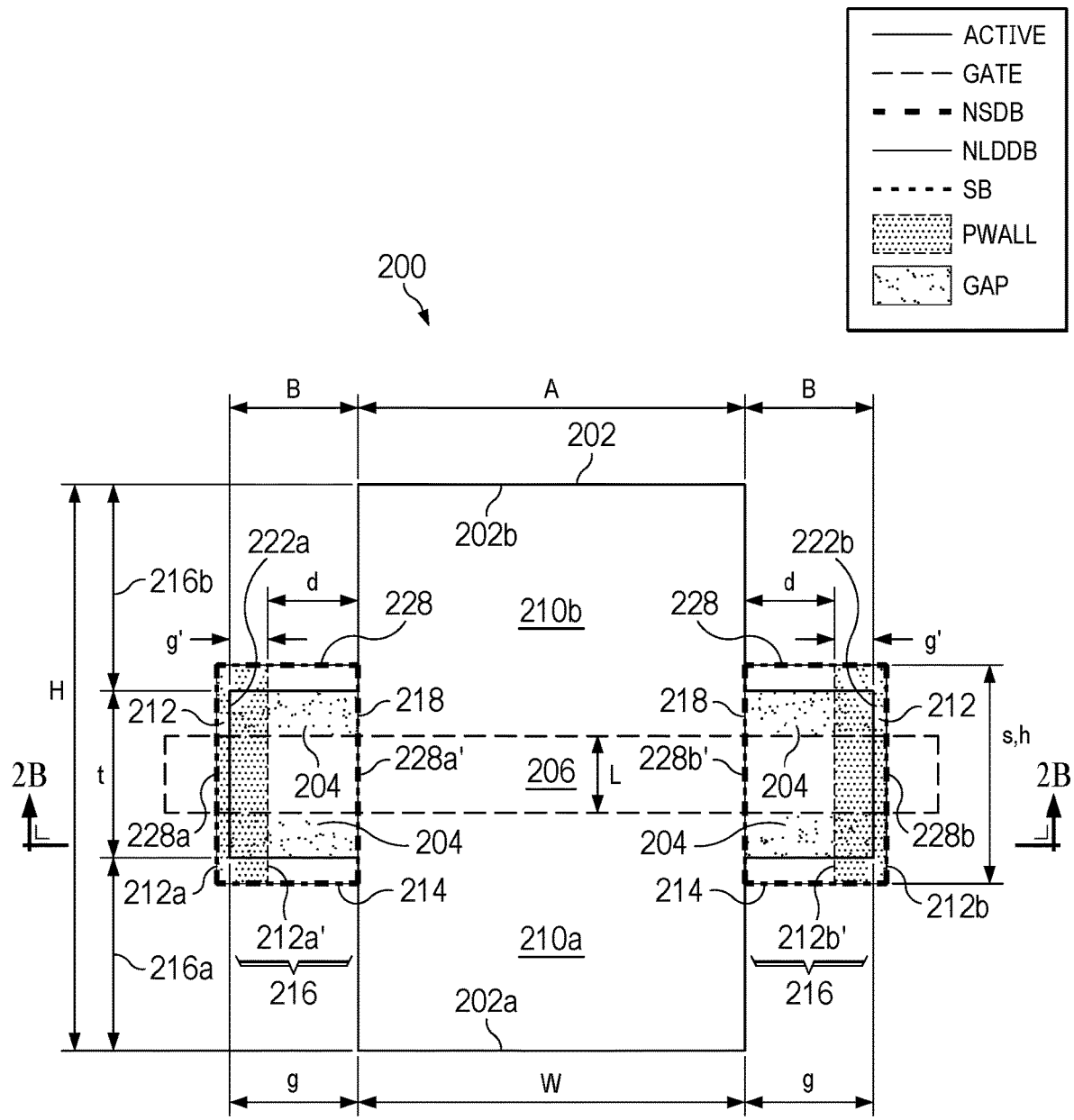
FIG. 2A is a schematic plan view or mask layout of a radiation-hardened NMOS transistor according to an embodiment of the present invention.

Referring now to FIG. 2A, a mask layout is shown of a radiation-hardened NMOS transistor 200 according a first embodiment of the present invention. An active region having the approximate shape of a "plus sign" has a boundary indicated by a solid line ACTIVE pattern 202. The active region defined by this boundary has an extent in the length direction with a total length of H, and in the width direction a total width of A+2B, where width A corresponds to a central substantially rectangular region that has a length H, and 2B is the total width of two tabs 216. Tabs 216 are positioned over a GATE pattern 206 (light long dash line) having length L as shown, and the tabs 216 both extend outward from the central region by a width B, in the illustrated embodiment. Each tab 216 has a length t that is less than total length H of the active region, and is offset from each end of ACTIVE 202, in this example by distances 216a, from bottom edge 202a of ACTIVE 202 to bottom edge of tab 216, and 216b, from top edge 202b of ACTIVE 202 to top edge of tab 216, respectively. Tab length t is typically chosen to be greater than gate length L as shown, so that the structures described herein, when fabricated, will be effective even in the face of misalignments to ensure that the outer edges or side boundaries 222a and 222b of the tabs extend at least the full length L of gate 206. Distances 216a and 216b need not be the same, nor do they both need to be nonzero; nor do tab widths B need to be equal. That is, in order to practice the principles of the present invention, a transistor layout need not be symmetrical, although this is common. However, in order to achieve a minimum device size, each feature may be set either to a minimum size dictated by a required function or to a minimum allowed by process design rules, and therefore, like features will in many embodiments have dimensions equal to each other and to such a minimum dimension.

Figure 1B:
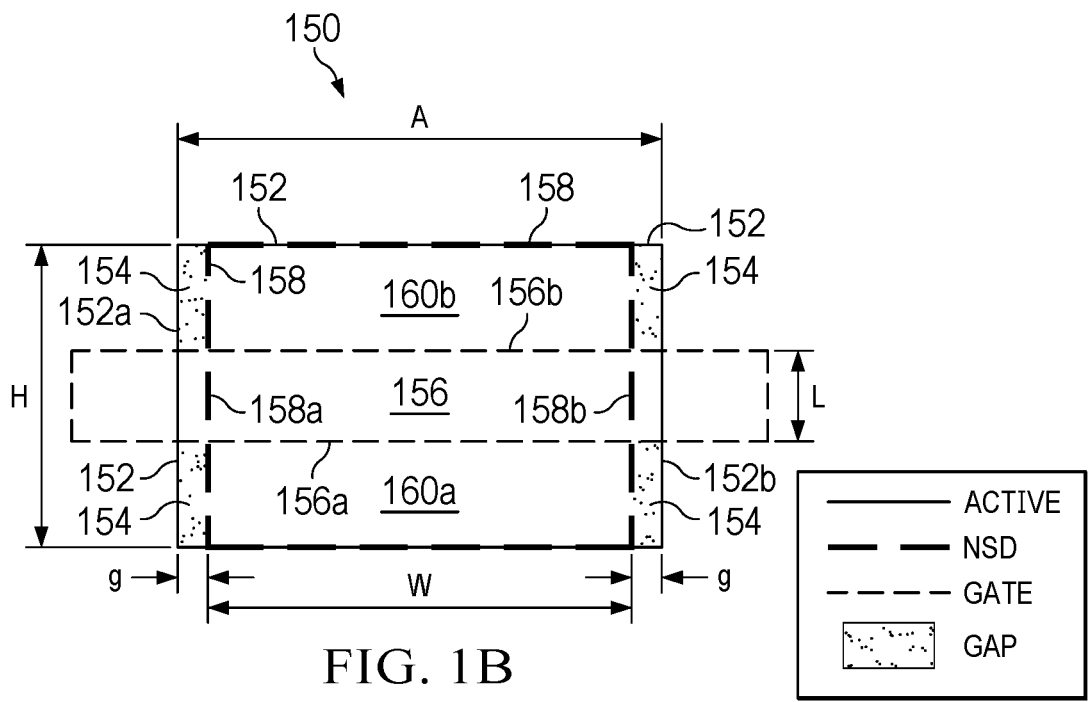
FIG. 1B is a schematic plan view or mask layout of a prior art NMOS transistor having radiation-hardened design features.

An exemplary shape of the NSD diffusion region is shown using heavy short dash lines specifying the outline of an NSDB pattern 228. In practice, and as is known to those skilled in the art, N+(NSD) diffusion regions may be defined in a mask layout not by areas defined by where NSD implants will go, as was indicated by rectangle 158 in FIG. 1B, but instead by ACTIVE 202 and one or more inverted mask layers NSDB (NSD Block) 228 that indicate where the NSD implant is to be blocked. N+ doping is implanted wherever there is ACTIVE 202 and an absence of NSDB 228, forming self-aligned source/drain regions 210a and 210b on either side of GATE 206 in the active region. Segments 228a' and 228b' are analogous to segments 158a and 158b in FIG. 1B in that they are pulled back (i.e., displaced inward toward the center of the active region) from the tab ends defined by first and second side boundaries 222a and 222b of ACTIVE 202, and thus displaced from parasitic edge channels that form along field oxide sidewalls where GATE 206 crosses over the boundary of ACTIVE 202. The distances (gap width g) that segments 228a' and 228b' are displaced inward from side boundaries 222a and 222b define gap regions 204 (indicated by a sparse random stipple pattern). In the embodiment illustrated, NSDB 228 is shaped into simple rectangles whose inner edges 228a' and 228b' are positioned so as to define gap widths g that equal the widths B of tabs 216. It can be seen that gap regions 204 (which may be alternatively considered as portions of a single gap region 204) are bounded by GATE 206, ACTIVE 202, and NSDB 228, similar to gap regions 154 in FIG. 1B. The same NSDB 228 pattern may be used to define where implants for LDD structures (in which NLDD is also n-type, but lower concentration than NSD) are to be placed (or blocked). However, different devices might call for different NLDD structures, so a separate mask NLDDB (NLDD Block) 218 is comprehended in the exemplary layouts herein, and shown coincident with the NSDB 228 pattern, as is a silicide block pattern SB 214, to be described in more detail later. NSDB 228 and the other blocking patterns 214 and 218 are shown oversized from tab 216. For example, outer edges 228a and 228b of the rectangles in the NSDB pattern 228 are shown as outside tab side boundaries 222a and 222b, respectively. The blocking patterns may be oversized, as is known in the art, in order to ensure that gap regions 204 are encompassed by patterns NSDB 228, NLDDB 218, and SB 214 (to exclude n-type dopants and silicide formation from the gap regions 204) in spite of misalignments during processing. The length of the pulled-back segment of NSDB 228 is shown as dimension s, which in this example embodiment is also the same length for all three blocking patterns NSDB 228, NLDDB 218, and SB 214. In FIG. 2A, not only are the segment lengths s for 228a' and 228b' greater than tab length t, but this example has three of four borders of blocking patterns NSDB 228, NLDBB 218, and SB 214 that are oversized beyond the extents of tabs 216. Oversizing the rectangular blocking pattern regions on the inner sides (further toward the center of active region 202) is unnecessary for alignment purposes, and would unnecessarily increase the size of gap regions 204, increase gap width g, and reduce source/drain diffusion region widths W.

The purpose of gap regions 204 is to increase the threshold voltage of parasitic edge transistors that can form along side boundaries 222a and 222b of ACTIVE 202, by removing the n-type doping in diffusion regions 210a and 210b from proximity with the field oxide sidewalls under gate 206. With the NSD pull-back, current leaking along the field oxide edge under gate 206 has to further traverse the gap region, which is lightly-doped p-type and not implanted N+. As described above, the gap regions 204 are defined by the shape of NSD blocking region NSDB 228. Blocking regions using NLDDB 218 and SB 214 need not be shaped such that they are exactly coincident with NSDB 228, but NLDDB 218 and SB 214 are also required to cover gap regions 204, in order to keep the moderate n-type doping of LDD structures out, which would increase parasitic edge leakage similar to the NSD doping, and also to prevent silicide from forming in the gap regions 204, which would short NSD (especially the drain) to the exposed substrate in the gap regions. Although preferred, not all, nor even any, of these blocking patterns NSDB 228, NLDDB 218, or SB 214 need extend all the way across GATE 206 as shown here (in which they are simple rectangles). Blocking patterns could be laid out in separate portions on either side of GATE 206, as long as together they cover gap regions 204. In this case, a pulled-back segment (analogous to 228a' or 228b') of NSDB 228 might consist of two segments separated by at least part of GATE 206, with a distance s measured along the length direction between the outer ends of these segments that are closest to the ends 202a and 202b of active region. However, in small-geometry device layouts, breaking blocking patterns into smaller separated areas can result in yield issues due to the creation of small photoresist particles during lithographic processing; and separated blocking regions on either side of GATE 206 might trigger design rules requiring gate length L to be longer than its minimum value.

Still referring to FIG. 2A, blocking regions NSDB 228, NLDDB 218, and SB 214 are all drawn having length s, and are thus all oversized in the length direction with respect to tab length t. Thus, the ends of pulled-back segments 228a' and 228b' can be seen to be separated by somewhat smaller distances from their respective nearest ends 202a and 202b of ACTIVE 202 than the offset distances 216a and 216b (which indicate distances separating the active region tabs 216 from active region ends 202a and 202b). These somewhat smaller distances from the blocking regions to active region ends are not labeled in FIG. 2A, but are indicated in FIG. 2C as distances 216a' and 216b'. It is these distances 216a' and 216b' measured to the ends of the blocking regions, which apply either to the notch geometry in FIG. 2C or to the tab geometry in FIG. 2A, especially for silicide blocking regions SB 214, that are most commonly limited to at least a minimum predetermined nonzero value dictated by process design rules. By making at least one of these distances 216a' and 216b' greater than or equal to the design rule minimum, close placement in the length direction of transistor 200 to respective neighboring devices or other essential features such as substrate contacts is permitted, as limited only by other design rules governing device spacing. At the same time, designs according to the present invention in which ends of tab 216 side boundaries 222a and 222b (as defined by distances 216a and 216b) are on opposite sides of GATE 206 (i.e., s>L for the simply-connected blocking regions shown in FIG. 2A), enable rad-hard transistors to be laid out having a minimum gate length L according to the design rules, with good high-frequency performance. Thus, high circuit densities and device performances approaching those of non-rad-hard commercial ICs may be achieved using rad-hard transistors designed according to the present invention.

As stated earlier, a transistor layout according to the present invention need not be symmetrical in either the length or width direction; for example, the tabs need not be the same size, nor do distances 216a and 216b need to be equal. One of offset distances 216a or 216b may even be zero, if close spacing to neighboring devices or structures is not required on that respective end of transistor 200. A radiation-hardened device may have a single tab 216 instead of two symmetrical tabs in some embodiments, such as in transistors that may mitigate TID-induced leakage at the other end of the gate using different techniques from the pull-back technique used here to create gap regions 204. If no such leakage reduction structure is in place on the other end of the gate, then the use of gap regions 204 on one end of a transistor gate will at least mitigate leakage on that end, reducing TID-induced leakage by, e.g., a factor of two. Indeed, other completely different shapes of ACTIVE 202 and NSDB 228 are possible without departing from the spirit and scope of the present invention, as will be seen later in another embodiment described with reference to FIG. 2C.

In some embodiments, optional moderately-doped p-type bands 212 may be formed along the active side boundaries 222a and 222b under gate 206, to place p-type doping (e.g., boron) along the field oxide sidewalls in order to increase the threshold of the parasitic edge transistors and further reduce TID-induced leakage, as depicted in FIG. 2A by the pattern labeled PWALL 212 using a regular stipple pattern surrounded by light dashes. This moderate-dose p-type implant is used to further increase radiation hardness, and may not be necessary in cases where a radiation tolerance goal is relatively low. A PWALL implant may be performed along the side boundaries 222a and 222b after the patterned field oxide is formed and before gate oxide and gate polysilicon are deposited. The length h of PWALL regions 212 is preferably at least as long as gate length L in order to cover the entire length of the parasitic edge channel formed under the gate 206, to interact with fringing fields from the edges of the gate, and may be longer than L, e.g., extending (for a 180-nm process) perhaps 0.4 micrometers beyond each edge of the gate 206 such that h=L+0.8 µm. PWALL length h can be as long or longer than tab length t, or equal to the blocking region length s as shown in FIG. 2A; but PWALL length h may need to be limited to less than active region length H, as are s and t for NSDB 228 and SB 214 and tabs 216, or one or both ends of PWALL 212 similarly offset from at least one end of ACTIVE 202 in order to avoid triggering design rule violations when used in close proximity to neighboring devices. PWALL 212 preferably is sized and positioned such that outer edges 212a and 212b of PWALL 212, corresponding the left and right tabs 216, respectively, overlap the active region side boundaries 222a and 222b as shown so as to ensure that the p-type dopant is placed directly along the field oxide sidewalls along boundaries 222a and 222b where parasitic edge transistor channels are formed. The inner edges of PWALL 212a' and 212b' extend into the gap regions 204 by a distance g' that is less than the gap width g, such that the implanted region ends a distance d=g−g' from segments 228a' and 228b' of the n-type diffusion regions 210a and 210b as defined by the NSD pattern, i.e., by NSDB 228. While TID-induced leakage is reduced (i.e., the threshold voltage of parasitic field edge transistors is increased) by the presence of the PWALL implant in regions PWALL 212, and may be reduced further by increasing the PWALL doping concentration, increasing the p-type doping concentration of the PWALL implant for a given distance d increases the parasitic threshold voltage at the expense of reducing electrical performance, for example, by decreasing the breakdown voltage of transistor 200. To compensate, increasing the distance d between the PWALL implant and NSDB border segments 228a' and 228b' (i.e., increasing the distance between diffusion regions 210a and 210b and the nearest border of PWALL 212) can allow the breakdown voltage of transistor 200 to be maintained for a given p-type concentration level within PWALL 212 that may be required to meet a predetermined level of TID performance (radiation tolerance level). Therefore, the PWALL parameters distance d and PWALL doping concentration can be selected to achieve a predetermined tradeoff, to improve TID performance while maintaining electrical characteristics such as breakdown voltage of transistor 200 the same at the expense of transistor area.

Figure 2B:
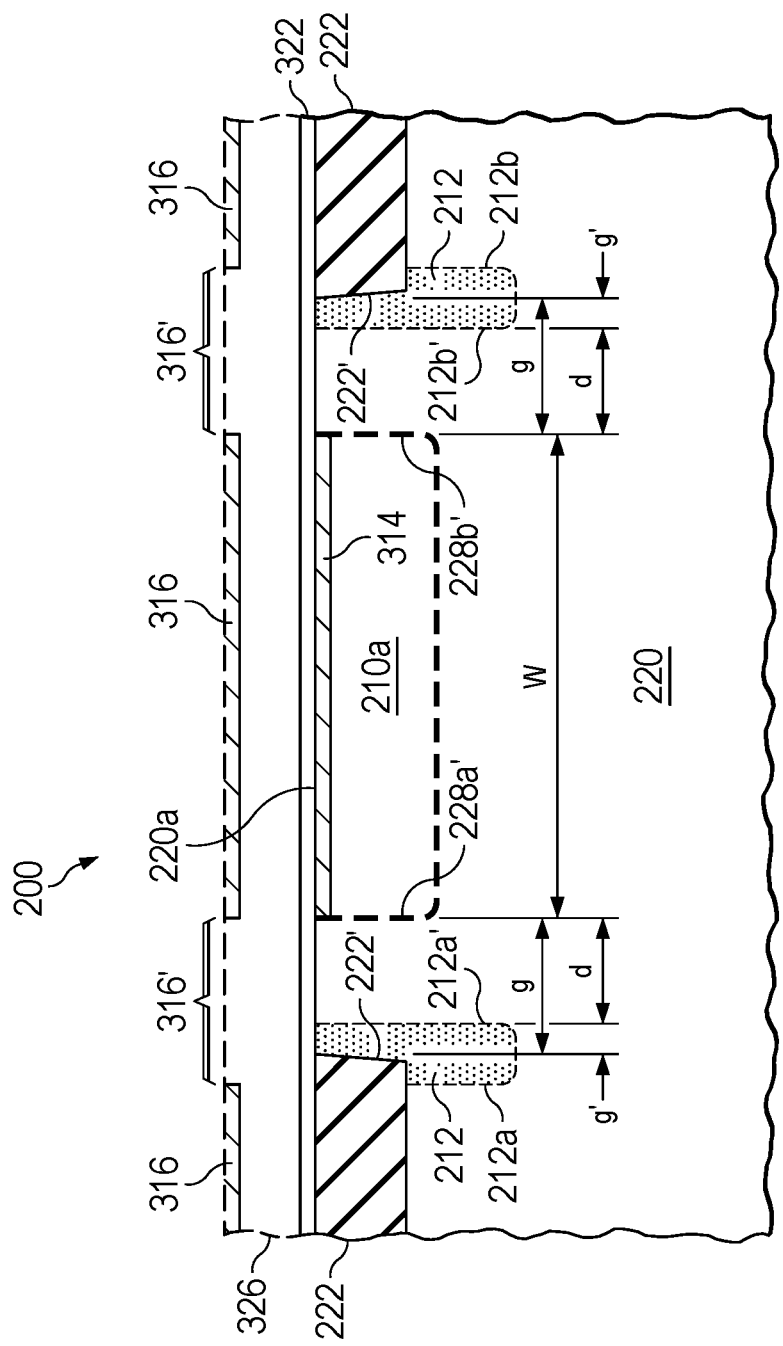
FIG. 2B is a schematic cross-section view of the transistor of FIG. 2A.
Figure 2C:
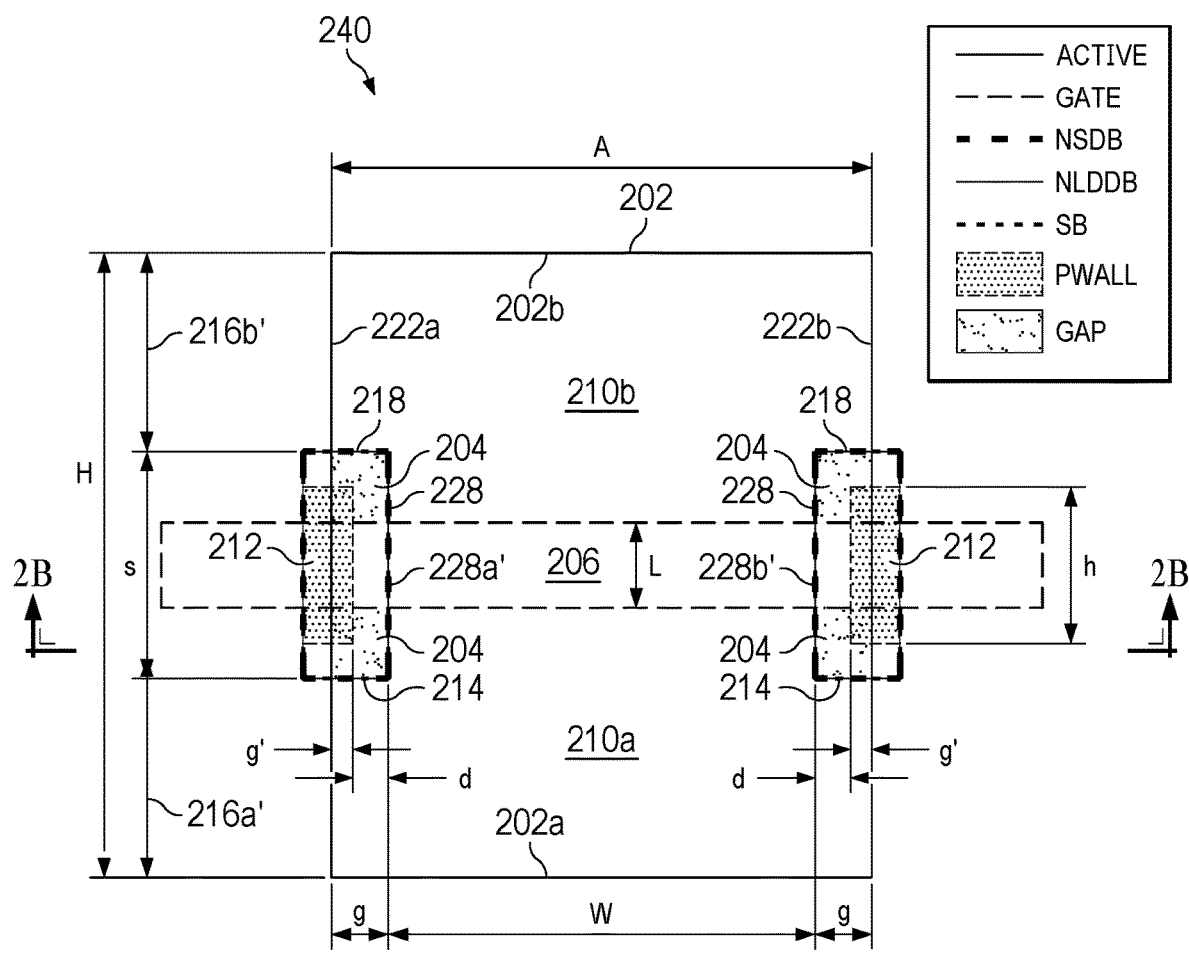
FIG. 2C is a schematic plan view or mask layout of a rad-hard NMOS transistor according to another embodiment of the present invention.

A schematic cross-section of a compact rad-hard transistor device 200 is shown in FIG. 2B, corresponding to a section indicated by 2B-2B through the device as shown FIG. 2A. A substrate 220 that is lightly doped p-type may be a lightly-doped p-type silicon wafer, or an epitaxial layer, or commonly a P-well region within a CMOS wafer. Field oxide 222 is shown as a shallow trench isolation (STI) structure in which oxide 222 is embedded into the wafer surface and planarized so that it is substantially level with wafer surface 220a. NSD diffusion region 210a doped N+ has width W, and can be seen to be pulled back from edges 222' of field oxide 222 so that its outer edges 228a' and 228b' are separated from field oxide 222 by a gap width g on both sides, as defined by the NSDB 228 mask used to exclude the N+ doping from the gap regions 204 (not labeled in FIG. 2B). Also not shown in this section is the placement of NLDD n-type dopants, since the section 2B-2B is spaced away from the gate sidewalls. NLDD dopants have a shallower extent than the NSD dopants in diffusion region 210a, and have a similar lateral (side-to-side in this view) extent to that of 210a since the NLDDB 218 mask pattern is shown coincident with that of NSDB 228 in FIG. 2A. Optional p-type bands 212 defined by the PWALL mask pattern are also shown along the edges 222' of the field oxide, and extend a distance g' into the gap regions, placing their inner edges 212a' and 212b' a distance d from the outer edges of diffusion region 210a. The p-type dopants in PWALL 212 are shown schematically to extend slightly under the field oxide 222 to outer edges 212a and 212b, where they can reach by direct ion implantation (e.g., using a tilted/rotation implant), and/or by diffusion in subsequent processing after an untilted implant. This is desirable to improve radiation hardness. For clarity, the depth of the p-type implanted band regions 212 are shown as deeper than that of trench insulator 222 and the depth of source/drain implant 210b; but in practice, the implant for the p-type bands may extend no deeper, or not much deeper, than the depth of the trench insulator 222.

A polysilicon gate layer 326 is shown on top of a thin gate oxide layer 322 grown on the surface 220a of substrate 220. The schematic boundary of the gate is shown as a dashed line in this section to indicate that the section 2B-2B does not pass directly through gate 206, but rather that gate 206 is seen in a plane behind that of the cross-section shown in FIG. 2B. Silicided layers are indicated by reference numeral 314 in the top surface of the silicon substrate (salicide) and by reference numeral 316 (polycide) in the polysilicon surface. Metal silicides may be formed using conventional processes and excluded from gap regions using silicide blocking layers patterned using mask layer SB 214. It can be seen that for the example layout of transistor 200 in FIG. 2A, as shown in cross-section FIG. 2B, salicide 314 is confined to the width W of the diffusion region 210a, and polycide 316 is excluded from regions 316' on the gate layer 326. Regions 316' lacking polycide result in high-resistivity segments of gate 206, that can be made more conductive using techniques to be discussed later with reference to FIGS. 4 and 7.

Referring now to FIG. 2C, a layout for an alternative embodiment of a compact rad-hard transistor 240 is shown. In this embodiment, ACTIVE 202 is substantially rectangular with total width A and total length H instead of having extending tabs, and side boundaries 222a and 222b run the full length H of the active region 202. Parasitic edge channels can again form along the field oxide under gate 206 where side boundaries 222a and 222b cross gate 206, and in rad-hard transistor 240, a similar strategy is employed to mitigate TID-induced leakage currents. Segments 228a' and 228b' of the border of the NSD diffusion are displaced inward (pulled back) by gap width g from side boundaries 222a and 222b to form gap regions 204, and this placement of the blocking regions NSDB 228, NLDDB 218, and SB 214 results in two "notches" into the active region 202. These notches have a length s that is less than the total length H of the active region and are separated from nearest ends 202a and 202b of ACTIVE 202 by nonzero distances 216a' and 216b' respectively, distances that are analogous to the corresponding distances 216a and 216b in the previous embodiment 200. The cross-section in FIG. 2B also applies to this transistor 240, with the section line passing through gap regions 204 and PWALL implants 212. Again, distances 216a' and 216b' need not be the same, nor both nonzero, and in order to practice the principles of the present invention, a transistor layout need not be symmetrical, while to achieve a minimum device size, each feature may be set either to a minimum size dictated by a required function or to a minimum allowed by process design rules. The layout shown in FIG. 2C can achieve similar density in the length direction as that of FIG. 2A, but for the same electrical width W, as determined by the widths of diffusion regions 210a and 210b adjacent to the gate 206, it has a larger area of diffusion regions 210a and 210b and therefore slightly higher capacitance. Alternative embodiments are also possible in which the geometry of blocking regions NSDB 228, NLDDB 218, and SB 214 do not cross GATE 206, but are divided into separate portions on either side of GATE 206, as described earlier for the tab geometry of FIG. 2A, as long as the gap regions 204 are covered.

Figure 3A:
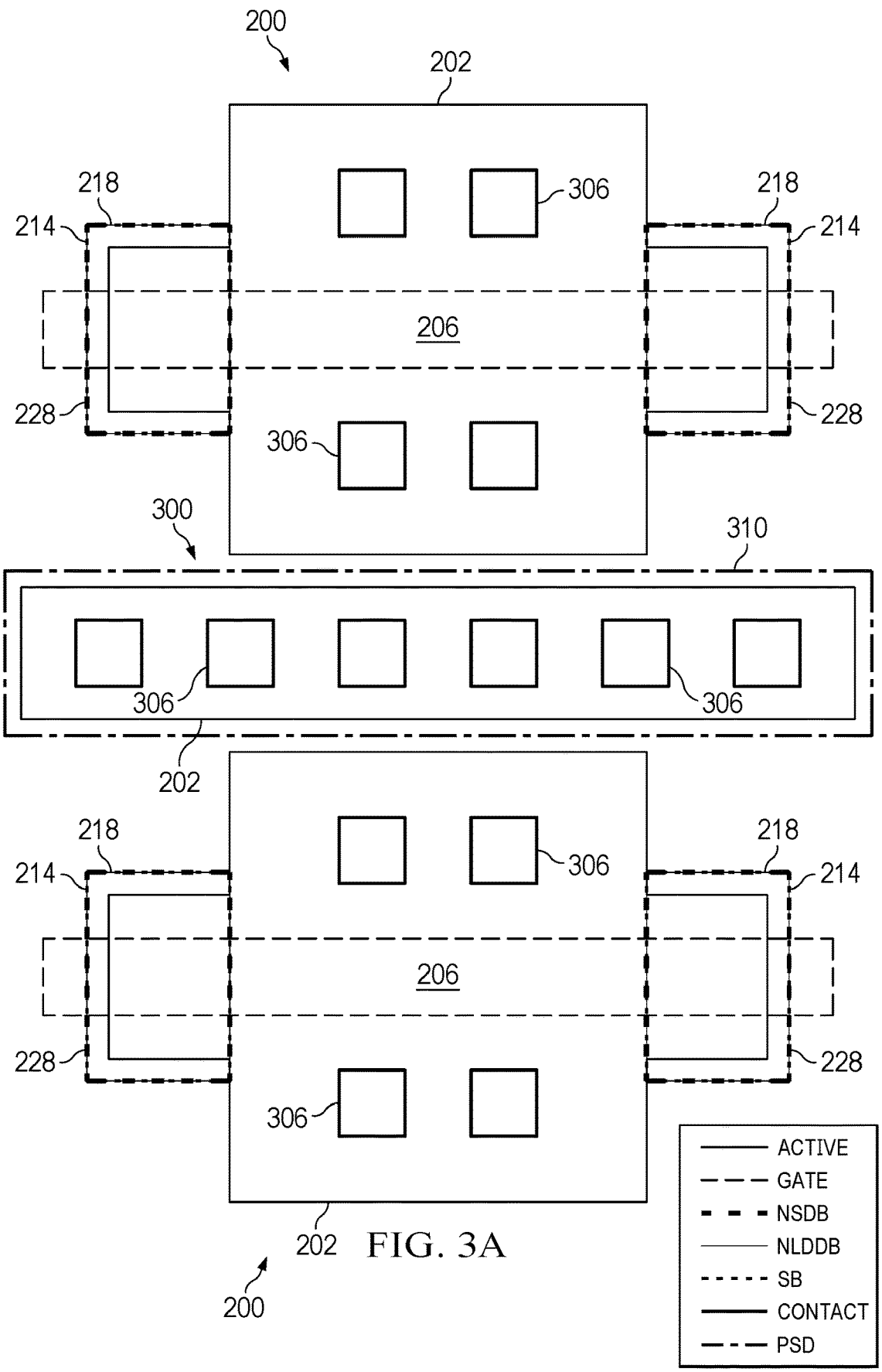
FIG. 3A is a schematic plan view of a portion of an integrated circuit according to an embodiment of the present invention in which rad-hard NMOS transistors are separated by a substrate contact.

FIG. 3A depicts a schematic plan view or layout of a region of an integrated circuit according to another embodiment, illustrating close placement of two rad-hard transistors 200 near to each other with a substrate contact 300 placed in between. Substrate contact 300 may be referred to as a guard bar or guard band in some applications, or it may be used as a transistor body connection. Close spacing is made possible using the principles of the present invention, in this case using plus-shaped active regions 202, and results in increased circuit density over prior art rad-hard transistor designs. Transistors 200 are shown having contacts 306 in the source and drain diffusion regions (not labeled), and for simplicity, p-type bands are omitted, showing only blocking layers NSDB 228, NLDDB 218, and SB 214. Substrate contact 300 comprises a PSD pattern 310 (long-short dashed line) that designates an area to be implanted with P+ through an opening in field oxide defined by ACTIVE 202 as shown, and contacts shown by CONTACT 306 (heavy solid line) are placed along the substrate contact 300, which are connected as needed, typically to $V_{SS}$ or ground, through interconnect lines (not shown) either using either polysilicon or metal interconnect layers. This example demonstrates that the tab geometry shown in FIG. 2A for rad-hard transistors 200 enables transistors and other essential features such as substrate contacts 300 to be placed a minimum distance apart from the rad-hard device 200.

This integrated circuit environment is common, especially in rad-hard or high-voltage circuitry, and the exemplary layout of FIG. 3A is intended to represent a number of common situations in which a substrate contact 300 might be employed. As will be seen in other embodiments, a P+ contact to the substrate (or to a P-well) may be used as a body connection for an NMOS transistor, also called a well tap or a back gate. In other situations, NMOS transistors are sometimes completely surrounded with substrate contacts called guard rings, to help prevent heavy ion induced latch-up for rad-hard applications. Guard rings and guard bars are also used to reduce sensitivity to latch-up and electrostatic discharge (ESD) and to block substrate noise currents in sensitive analog inputs and mixed-signal circuit applications.

In compact layouts, active regions 202 can contain multiple rad-hard transistors 200 or 240 for improved electrical matching and to implement rad-hard circuit designs that can be used, e.g., in analog circuits such as current mirrors (like that described later in reference to FIG. 6D) or differential stages. In a current mirror application, substrate contact 300 in FIG. 3A may represent a portion of a guard ring structure separating one active region 202, containing at least two matched rad-hard transistors, from a second active region 202 containing a group of at least two cascoded transistors that can be either rad-hard or non-rad-hard.

Figure 3B:
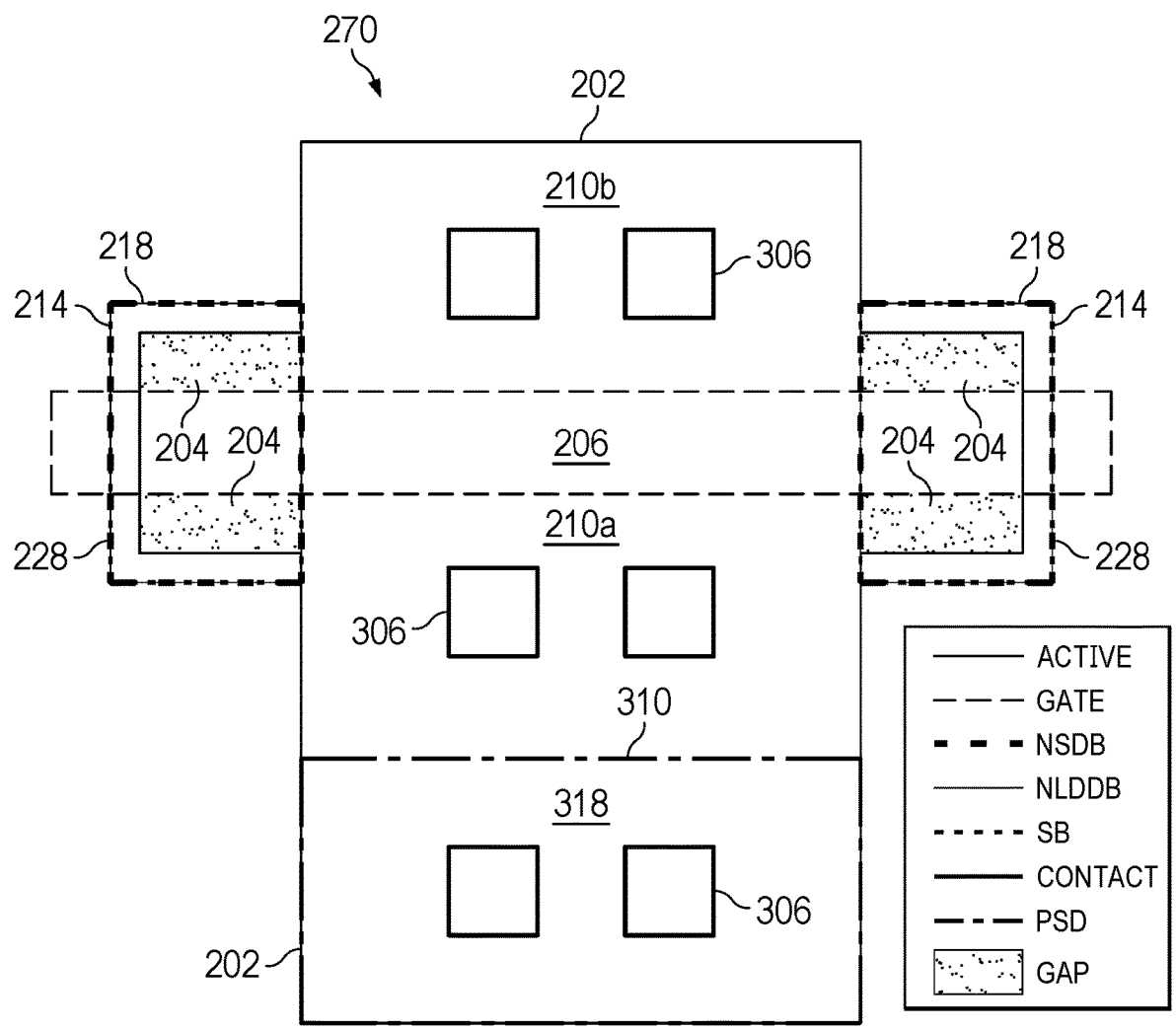
FIG. 3B is a schematic plan view or mask layout of a rad-hard NMOS transistor having an abutting body connection according to another embodiment of the present invention.

To prevent latch-up, body connections should be provided close to most transistors in an IC. Some CMOS processes allow a body connection to be abutted to a transistor, by permitting a P+ region adjacent to a N+ source/drain within the same active region 202, as illustrated in the layout of FIG. 3B, showing a rad-hard NMOS transistor 270 having an abutting body connection. An abutting body connection permits a particularly compact layout for a transistor, as in this example, and such a device can be placed closer to neighboring transistors using the principles of the present invention. Specifically, in NMOS transistor 270, a PSD pattern 310 is used to create a P+ diffusion region 318 placed within ACTIVE 202, adjacent (abutting) N+ source region 210a. The tab geometry, with gap regions 204 and blocking patterns 228, 218, and 214 separated from the end of ACTIVE 202 that encompasses drain region 210b, allows placement of another device, well, or contact close to transistor 270 on the side neighboring region 210b. Diffusion regions 210a, and 210b, and 318 may be sized just large enough to permit placement of contacts 306. Silicide (not shown) outside silicide block SB 214 formed on the diffusion regions 210a, 210b, and 318 (as well as on top of gate 206) may be used to reduce the sheet resistance of those areas, and to form a low-resistance connection between source 210a and the body connection formed by diffusion region 318.

Figure 4:
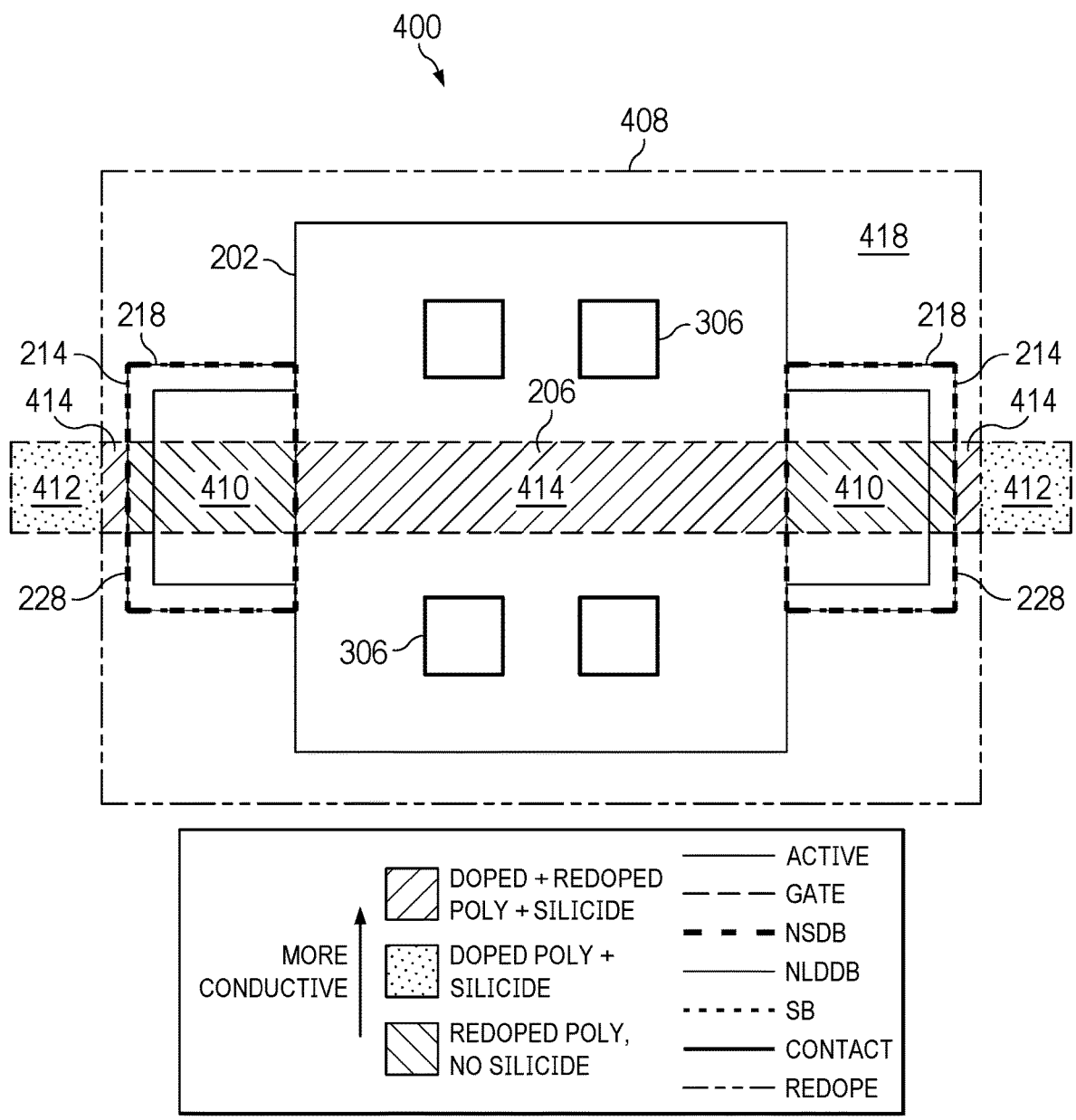
FIG. 4 is a schematic plan view or mask layout of a rad-hard NMOS transistor showing doping patterns for improving gate conductivity according to another embodiment of the present invention.

Regions that lack polycide due to the use of continuous silicide block patterns 214 that cross gate 206 were mentioned previously in reference to FIG. 2B. Referring now to FIG. 4, a layout for a radiation-hardened NMOS transistor 400 is depicted that demonstrates a technique to increase the conductivity of gate regions 410 that lack polycide because they are covered by silicide block pattern SB 214. As explained with respect to FIG. 2B, silicide regions will form on silicon and polysilicon surfaces except where blocked using a silicide blocking layer patterned using SB pattern 214. During a CMOS fabrication process, the polysilicon layer is conventionally doped N+ or P+ at some point in the process to make it more conductive for interconnect, achieving a resistivity of the doped poly of on the order of a few tens of ohms per square. Later in the process, silicidation of the poly lowers the resistivity to only a few ohms per square. Even short lengths of un-silicided poly in the gate 206 can have a significant impact on series resistance and thus device performance. To reduce resistivity in such areas, an additional doping step referred to herein as "redoping" may be performed. In this step, a high-dose N+ implant is performed at least in regions containing rad-hard NMOS transistors of the design of the present invention. This implant may be performed before etching the gate, using a REDOPE pattern 408 to increase the n-type dopant concentration in the polysilicon layer over transistors 400. REDOPE pattern 408 may be used to selectively restrict redoping only to areas 418 where it is wanted. The polysilicon gate material is doped by this implant, but since it occurs before the poly etch, the redoping implant may be blocked by the continuous polysilicon layer and by photoresist outside the REDOPE 408 pattern from impinging on areas where N+ doping is unwanted such as P-wells and PMOS transistors. In some fabrication processes, gate regions 410 would be effectively lightly-doped without this redoping process, due to NSD and PSD mask design requirements, and thus redoping is required. Assuming that there is a single doping step for polysilicon interconnects 412 outside the REDOPE 408 region, FIG. 4 labels areas in order of increasing conductivity after redoping and silicidation: regions 410 in silicide block areas 214 are redoped, but have no silicide, so have the lowest conductivity; regions 412 that receive doped poly from the rest of the IC process as well as silicide have a higher conductivity; and regions 414 corresponding to gate 206 regions across most of rad-hard NMOS transistor 400 that receive all of doping, redoping, and silicide have the highest conductivity (lowest resistivity).

REDOPE pattern 408 can be designed several ways to restrict redoping. The smallest areas that need redoping are at least the gate areas 410 within the blocking pattern SB 214. There is no need to restrict redoping to these small areas, with possibility of alignment problems. The redoping process can be restricted to individual rad-hard NMOS devices using a slightly larger REDOPE 408 pattern as shown in FIG. 4 resulting in a redoped region 418 large enough to encompass the entire NMOS transistor and not encounter any alignment issues. Finally, these redoping patterns might be applied only on certain dice or regions of a wafer (substrate). This strategy allows fabrication of rad-hard ICs on, e.g., a multi-project wafer (MPW) without interfering with the process used on other parts of the wafer by other customers.

Figure 5:
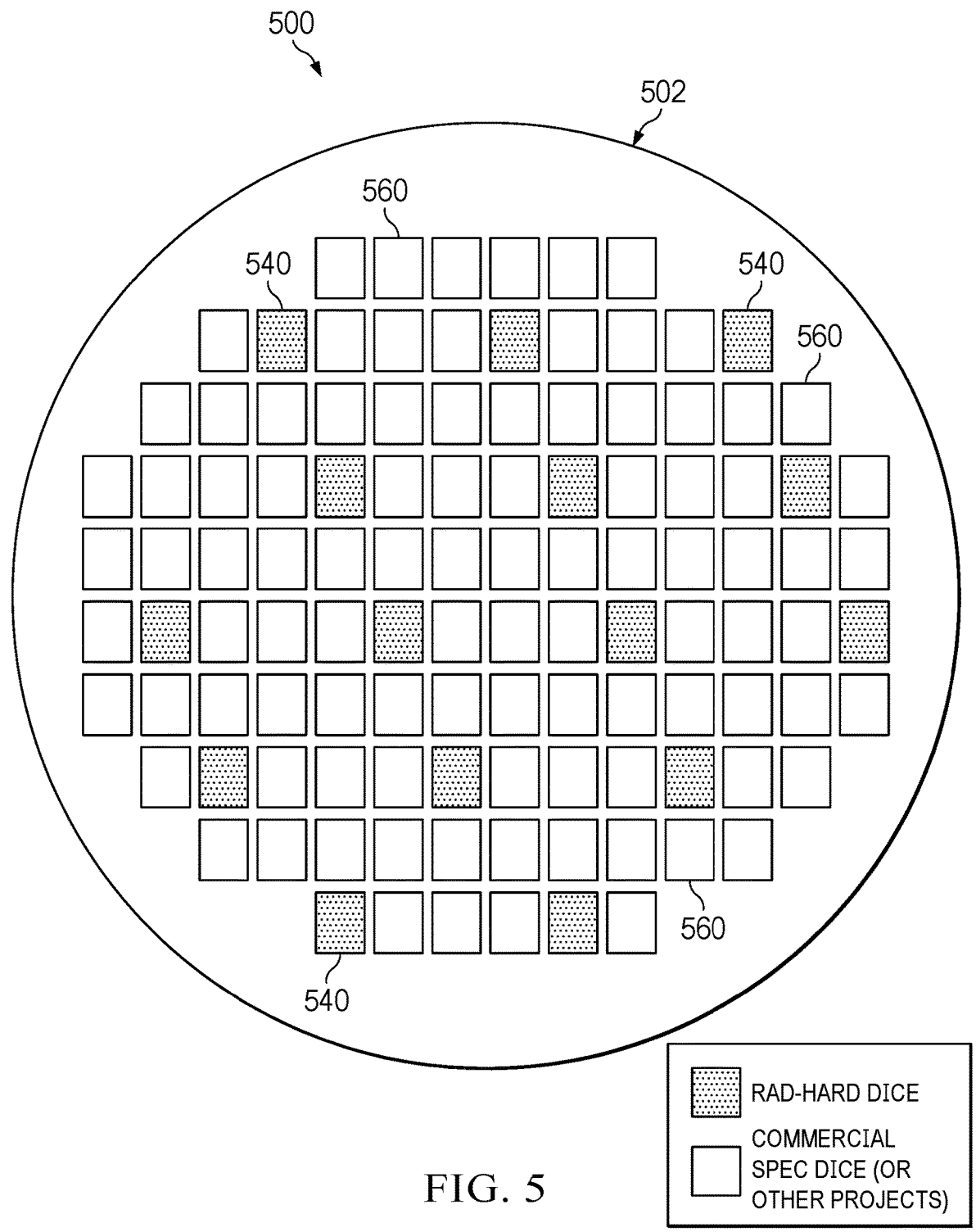
FIG. 5 is a schematic plan view of a semiconductor wafer containing a number of integrated circuit dice containing rad-hard devices according to another embodiment of the present invention.

A schematic plan view of a semiconductor wafer 500 that may contain rad-hard devices in some IC dice and not others is shown in FIG. 5. This drawing depicts a silicon wafer 502 containing at least two types of IC dice, rad-hard IC dice 540 and IC dice 560 that do not contain rad-hard devices. Dice 560 may belong to other customers of a multi-project wafer run, or may contain different products by the same owner. There may be more types of IC dice than two, having differing levels of radiation tolerance, circuit density, and device performance such as breakdown voltage and capacitance/speed. As discussed with respect to the p-type PWALL structures, tradeoffs between radiation tolerance and these performance parameters may be performed and devices and ICs tailored for these different tradeoffs using the principles taught herein. This may permit a company to optimize profit by customizing their product mix within a wafer, which is particularly important when few expensive wafers are being fabricated.

Figure 6A:
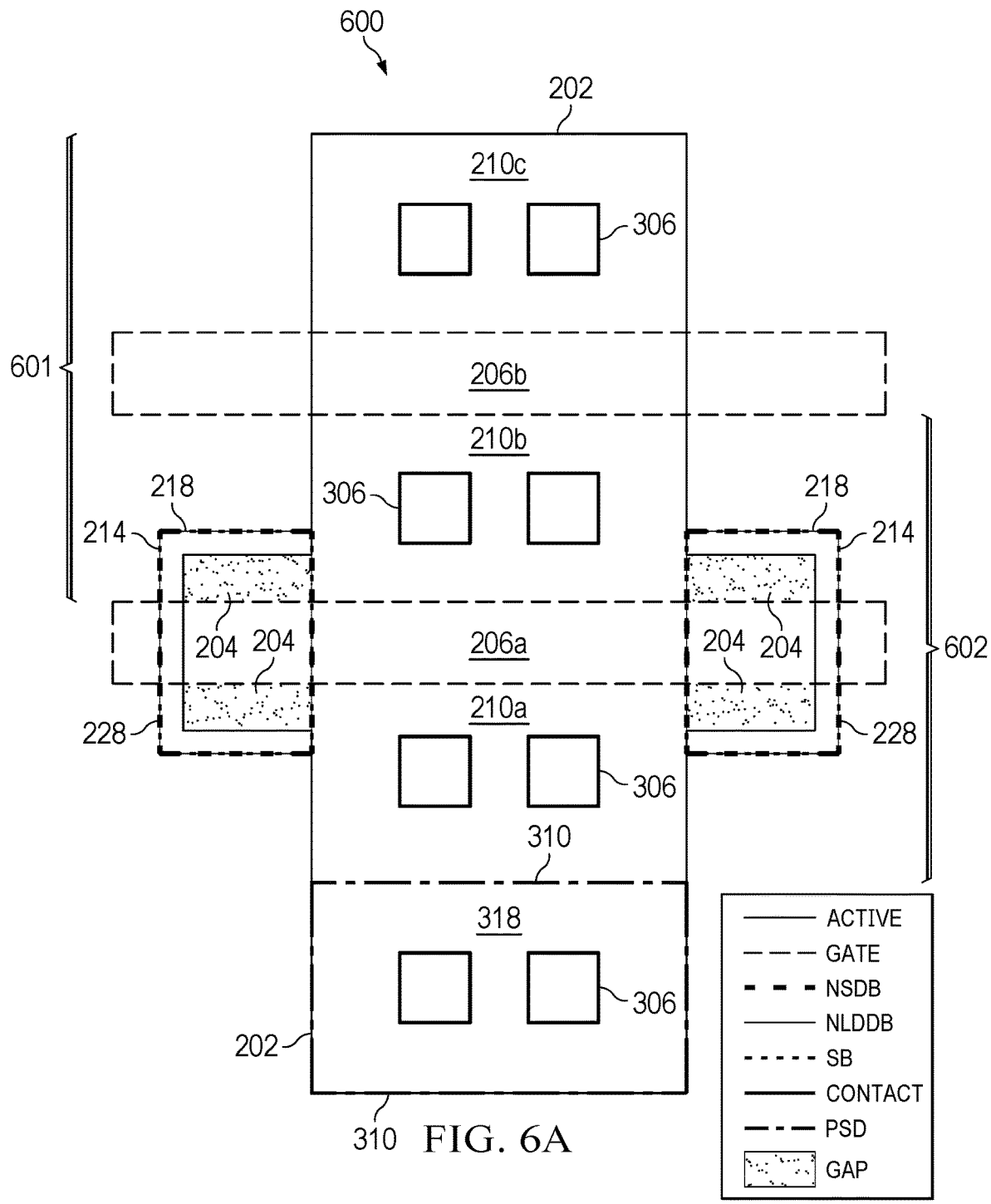
FIG. 6A is a schematic plan view or mask layout of a compact rad-hard NMOS transistor pair according to another embodiment of the present invention

Referring now to FIG. 6A, an exemplary layout for a compact series-connected rad-hard NMOS transistor pair 600 is depicted. Neighboring series-connected transistors may not only touch, but can even share a diffusion 210b as shown. Transistor pair 600 comprises a non-rad-hard NMOS transistor 601 adjacent to and contiguous with rad-hard NMOS transistor 602; the source 210b of transistor 601 overlaps the drain (also 210b) in a shared (or merged) diffusion. Contiguous transistors can have larger partially-overlapping sources and drains, but complete overlap or "merging" source and drain into a single minimum-length shared NSD region 210b as shown here minimizes device size and thus maximizes circuit density. Contacts 306 within may be deleted, for further space saving, if a series connection of the source of one transistor to the drain of the next is required without requiring a connection to other parts of a circuit. Transistor 601 is a conventional NMOS transistor without tabs, having gate 206b and diffusion region 210c acting as a drain. It may be desirable to lay out transistor 601 non-rad-hard like this in order to optimize performance, since a rad-hard transistor has slightly higher capacitance due to the tab areas; but transistor 601 could also be a rad-hard transistor like 602 without increasing the required layout area, as will be discussed later in reference to FIG. 6C. For further compactness, P+ body connection 318 is shown abutting source 210a of transistor 602, and body connection 318 can be shared with transistor 601 for its body connection in the same substrate area or P-well.

Figure 6B:
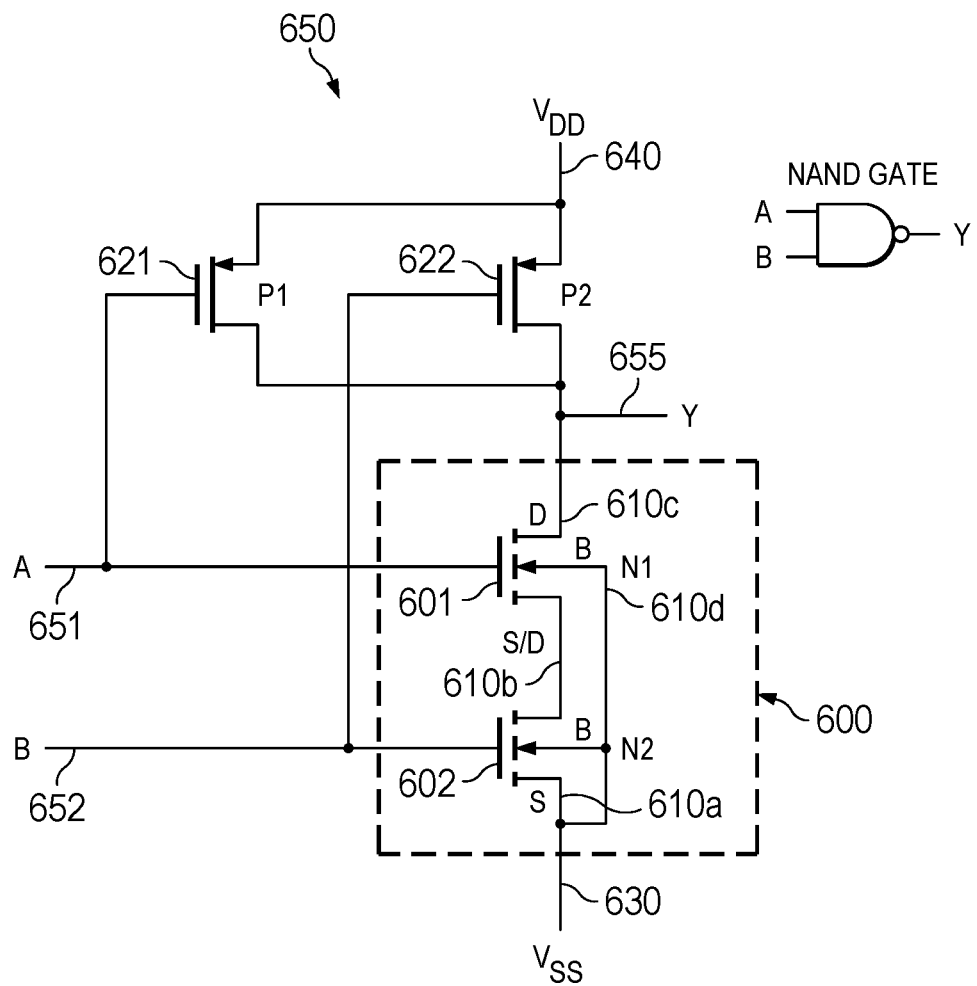
FIG. 6B is a schematic circuit diagram of a rad-hard NAND gate using the compact transistor pair shown in FIG. 6A.

An example of a circuit for a compact rad-hard CMOS logic gate 650 is shown in FIG. 6B. A series transistor pair 600 as shown in FIG. 6A, comprising transistors 601 (N1) and 602 (N2), may be used for the A logic input 651 and B logic input 652 of a NAND gate, which has a Y logic output 655. (A and B label the logic inputs in FIG. 6B and are not to be confused with the similarly-named dimensions in earlier figures.) PMOS transistors 621 (P1) and 622 (P2) are used conventionally, and their body connections are not shown for simplicity. Their sources are connected to positive supply node 640 (VDD). The source 610a of rad-hard transistor 602 (N2) is connected to node 630 ($V_{SS}$ or ground) as is the shared body connection 610d. The drain 610c of transistor 601 (N1) is connected to transistors 621 (P1) and 622 (P2) as well as to logic output 655 (Y). Node 610b represents the internal connection of the drain of transistor 602 (N2) with the source of transistor 601 (N1) via the sharing of merged diffusion region 210b as shown in FIG. 6A. Series-connected NMOS transistors like this can be used in other circuits including analog circuits as will be seen later.

It can be seen that the series pair 600 is rad-hard even though only one of its transistors is rad-hard. This is because in a series connection, only one of the transistors needs to have low radiation-induced leakage currents, since that rad-hard device will block leakage currents that would otherwise flow through the non-rad-hard device. Either transistor (or both) of the pair can be radiation-hardened to make a rad-hard series pair 600. Thus, the position of a rad-hard transistor in the pair and the body connection may be selected to result in a minimum-size layout. Note that more than two NMOS transistors may be used in series, e.g., to make multiple-input NAND gates, and laid out using similar principles, and as long as one of a string of series-connected transistors is rad-hard (has low leakage in response to TID), the leakage will be limited for the entire string.

Embodiments of the invention result in an improvement in rad-hard circuit density. A common metric for circuit density is the number of NAND gates per square millimeter that can be integrated; a typical benchmark value of the metric for a 180-nm commercial IC process is seventy to eighty thousand NANDs/mm$^2$, and this technology can be used to approach that density.

Figure 6C:
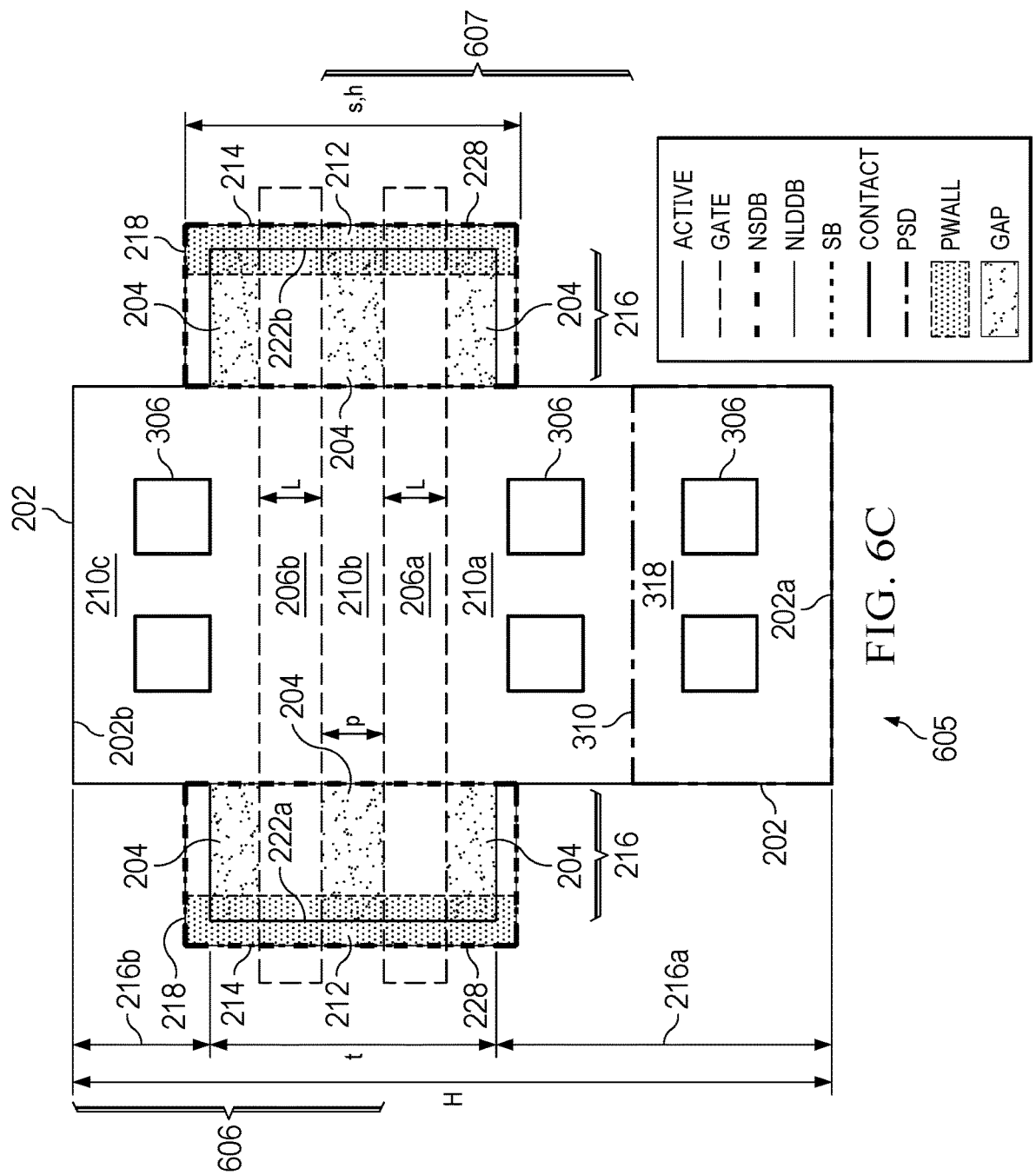
FIG. 6C is a schematic plan view or mask layout of a compact rad-hard NMOS transistor pair according to yet another embodiment of the present invention.

Since there is no connection to node 610b within the series pair 600 as used in the NAND gate 650, an even more compact layout can be achieved using the series pair design to be described now with reference to FIG. 6C, which depicts a schematic plan view or layout of a series transistor pair 605 comprising two rad-hard transistors 606 and 607 sharing a common diffusion region 210b. In this embodiment, because there are no contacts 306 within diffusion 210b, the spacing p between gate 206a of transistor 607 and gate 206b of transistor 606 may be minimized as allowed by process design rules, for example, as small as a minimum gate length L as shown. Gates spaced this closely can share tabs 216 on ACTIVE 202 that have a width t wide enough to cover both gates. The same strategies as for a single rad-hard NMOS transistor 200 in FIG. 2A are used to design the blocking regions 228, 218, and 214 to create gap regions 204 by pulling back segments of the border of NSDB 228 from active region side boundaries 222a and 222b. These segments are made longer (longer length s) to cover the longer tabs 216. Likewise, longer (longer length h) p-type bands PWALL 212 and similar gap widths and associated dimensions apply to this design. This design for series transistors is more compact than one using separate tabs 216 for each gate (e.g., 206a and 206b), and the design can be extended for use with more than two gates simply by elongating tabs 216 in the length direction. The overall length H of active region 202 must just be long enough to accommodate the tabs 216 and to maintain separations 216a and 216b of the tabs from active region ends 202a and 202b, respectively, at least one of which is nonzero and that is equal to or greater than the minimum distance that is allowed by design rules.

Figure 6D:
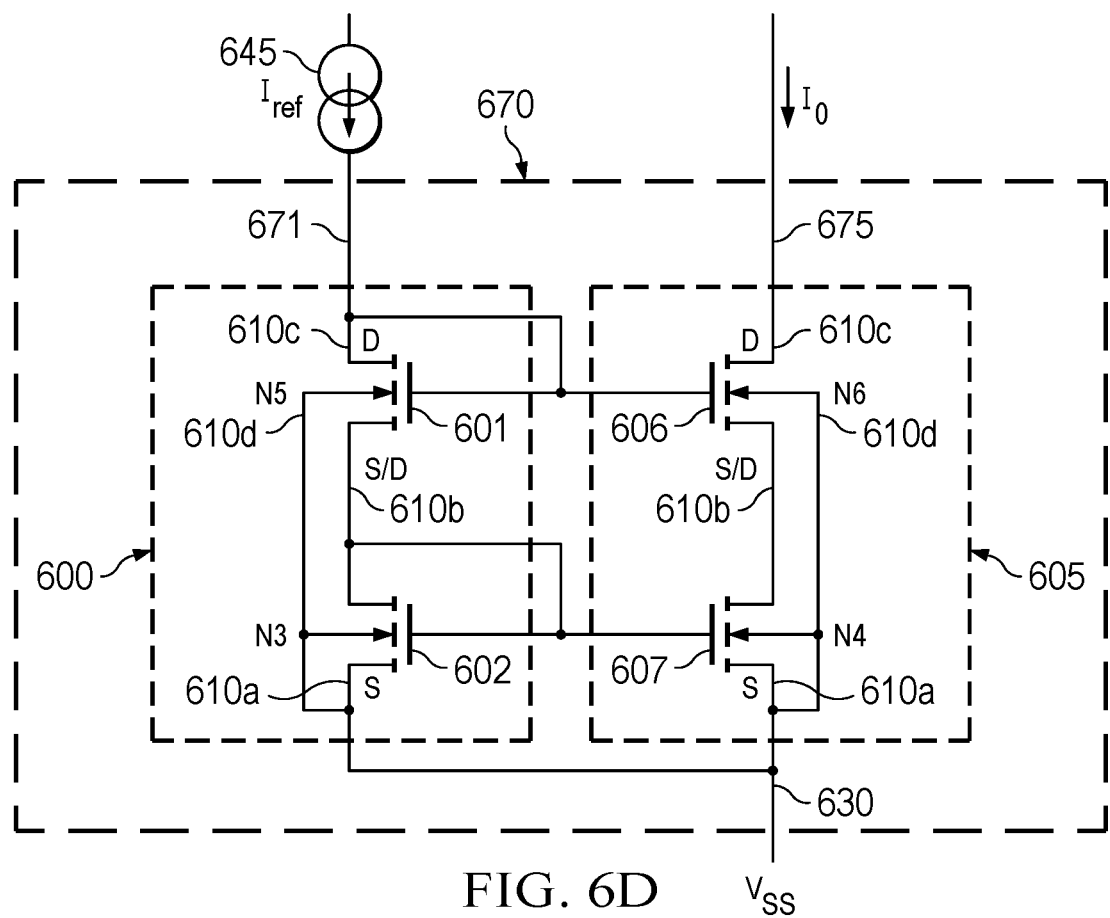
FIG. 6D is a schematic circuit diagram of a rad-hard current mirror using the compact transistor pairs of FIGS. 6A and 6C.

Referring now to FIG. 6D, a schematic circuit diagram of a cascoded rad-hard current mirror 670 is shown, depicting an example application of rad-hard NMOS transistor series pairs 600 and 605 in analog circuitry. In this circuit, radiation-induced leakage is minimized by using the rad-hard transistor pairs 600 and 605. The current mirror functions to generate an output current $I_o$ at node 675 that mirrors the reference current $I_{ref}$ supplied by reference current source 645 and entering node 671. The circuit uses two diode-connected NMOS transistors, transistor 601 (N5) and cascoded transistor 602 (N6) within series pair 600 on the left-hand side, whose gates are connected to the gates of series pair 605 on the right-hand side comprising transistors 607 (N4) and 606 (N6). Contacts 306 within shared source/drain 210b of transistor pair 600 are used to make the diode connections between gates and drains. The drain 610c of transistor 601 (N5) is connected to reference current input node 671, and drain 610c of transistor 606 (N6) is connected to output current node 675. The source nodes 610a of both pairs, and all body connections, are connected to node 630, shown here as $V_{SS}$ or ground, but may be at any potential sufficiently that is lower than the potential of current terminals 671 and 675. (Note that the labeling of nodes 610a, 610b, 610c and 610d similarly within each of pairs 600 and 605 is not meant to indicate that they are connected to each other, but instead to show correspondence with diffusion regions 210a, 210b, and 210c and body connection 318 in both.)

Although transistor 601 may be non-rad-hard as discussed previously, and series-connected transistors 600 and 605 are referred to herein as "pairs" due to their compact layout, for optimal performance of a current mirror, it may be preferable to match the characteristics of the functional pair 602-607 (N3-N4), the lower pair in the schematic; 601-606 (N5-N6), the cascoded upper pair, need not be matched. A layout in which these transistors 602 and 607 (N3 and N4) share an active region could lead to better matching in a current mirror than using the pairs as illustrated in FIG. 6D. In either case, not all four of the transistors need to be rad-hard, if the rad-hard transistors are judiciously deployed to limit radiation-induced leakage currents.

Figure 7:
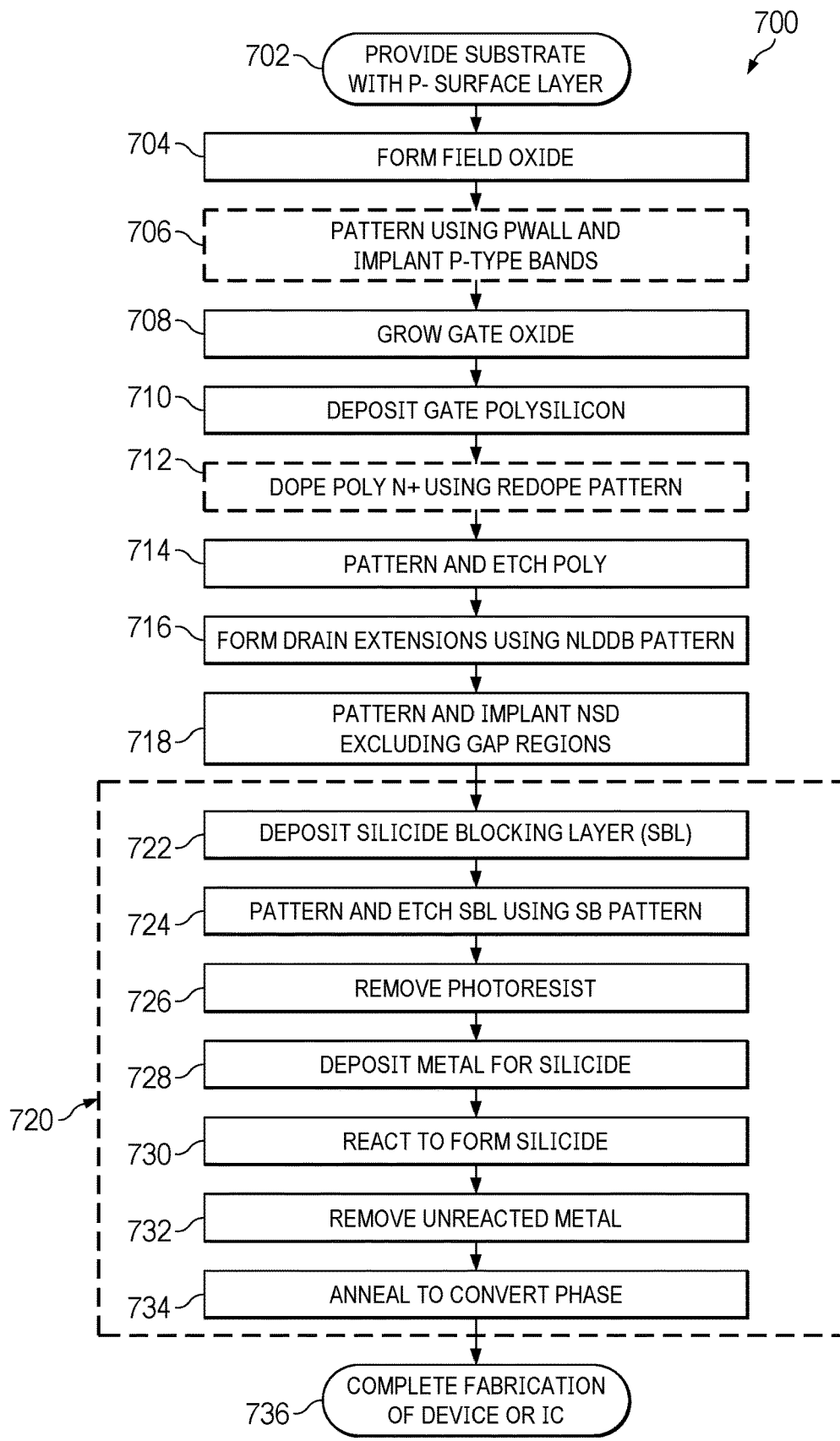
FIG. 7 is a flow chart depicting a method for fabricating a rad-hard device or integrated circuit according to an embodiment of the present invention.

Referring now to FIG. 7, a flow chart is shown of a process 700 for fabricating a rad-hard device or integrated circuit according to the present invention. The process starts in step 702 by providing a substrate such as a silicon wafer having a P– surface layer. The P– surface layer may be an epitaxial layer, a P-well, or a wafer that is lightly-doped p-type throughout. In step 704, a field oxide is formed in the surface of the substrate, which may be a planarized Shallow Trench Isolation field oxide that extends into the surface of the substrate. The field oxide is formed using an ACTIVE pattern that defines active regions within which the field oxide is absent and within which transistors will subsequently be formed. In an optional step 706, moderately-doped p-type bands may be implanted using a PWALL pattern that positions p-type dopant along field oxide edges under where NMOS transistor gates will cross. Additional steps known to those with skill in the art may include growing a dummy gate oxide before an implantation step, and any conventionally required steps such as photoresist removal and cleaning steps that are not explicitly enumerated in the flow chart. In step 708, a thin gate oxide is grown in the active region, after which a polysilicon (poly) layer is deposited in step 710 that will be used to form transistor gates and local interconnects. Another optional step 712 may then be performed before the gate layer is etched, which is to perform an additional N+ doping of the poly over rad-hard NMOS transistors that may later incorporate silicide that is blocked from forming over portions of their gates. This additional doping step 712 may be performed using a REDOPE pattern that restricts the N+ doping to regions of the substrate that contain at least one radiation-hardened NMOS device. Next, in step 714, the poly is patterned and etched to form local interconnects and transistor gates, wherein a rad-hard transistor gate crosses from one edge to an opposite edge of a boundary of the active region defining a radiation-hardened NMOS device. After the gates are etched, steps to form lightly-doped drain (LDD) structures are performed, as represented by step 716, in which source/drain extensions ("drain extensions") on at least one side of a gate are formed using a pattern such as an NLDD Block pattern (NLDDB) that excludes the n-type doping of the LDD structures from within gap regions that will be defined by an NSD (n-type source/drain) implant pattern. Step 718 then comprises patterning and implanting NSD (N+ dopants) in source/drain diffusion regions of NMOS transistors, using an NSD or NSDB (NSD Block) pattern that excludes N+ doping from gap regions having a gap width g that are positioned adjacent at least one of the edges of the boundary of the active region, as described more fully with reference to the rad-hard NMOS device layouts shown in FIGS. 2A and 2C and several other figures above. In some processes, the steps used in formation of LDD structures may exchange the order of steps 716 and 718, but the order given is most commonly used in commercial processes. Then a common but optional step 720 of forming silicide may be performed, using one of several methods depending on the precise type of metal used to form the silicide. If silicide is formed, it is excluded from forming in the gap regions in the rad-hard NMOS devices within which NSD and NLDD are also excluded, and may use the exemplary salicide process flow that follows, which omits detailed description of some conventional steps such as cleaning processes.

Step 722 in silicide formation process 720 involves depositing a silicide blocking layer (SBL) such as silicon oxide, silicon nitride, silicon oxynitride, or another material on which silicide will not form. The SBL is next patterned and etched in step 724, using a silicide block (SB) pattern that allows the SBL material to remain over the gap regions in order to prevent formation of silicide in the gap regions. Photoresist used to pattern the SBL is removed in step 726. Next, in step 728, a silicide-forming metal is deposited, which may be one of several refractory metals known in the art such as titanium, cobalt, nickel, platinum, palladium, molybdenum, tungsten, and tantalum. The example process 720 shown in FIG. 7 assumes the use of cobalt as the silicide-forming metal. A sintering step 730 is performed to react metal in contact with silicon or polysilicon that is exposed in areas not covered by SBL in order to form a metal silicide. Unreacted metal is removed in step 732 using a selective etch, leaving silicided areas in transistor diffusion areas and polysilicon gates and interconnects, and unsilicided areas of silicon and polysilicon where the SB pattern left SBL material in step 724. In the case of cobalt or some other metals, an additional anneal step 734 may be performed to convert the metal silicide from one phase (e.g., CoSi) to a phase (e.g., $CoSi_2$) having lower resistivity, which in the case of cobalt silicides can be lower by a factor of 5-10. Thus, low-resistivity silicide is formed on silicon and polysilicon regions, but excluded from gap regions where silicide would short source-drain diffusions to a grounded substrate. If a silicide block (SB) pattern is used in step 724 that prevents silicide formation on portions of the gate polysilicon in rad-hard NMOS devices, then the optional redoping step 712 as described above may have been performed earlier in the process to raise the conductivity (i.e., lower the resistivity) of the unsilicided portions of the gate polysilicon. After the optional metal silicide has been formed and patterned to exclude it from the gap regions, all other remaining steps in device fabrication of the IC are performed in final step 736, which may include removing the SBL, depositing and etching interlayer dielectrics and metal interconnect levels, and other conventional steps used to complete a functional integrated circuit.

According to embodiments of the present invention, radiation-hardened NMOS transistor devices are provided that have low TID radiation-induced leakage currents and permit high-density circuit layouts. The transistor devices of the present invention are suitable for application individually, or in digital logic or analog circuitry within NMOS, CMOS, BiCMOS, and/or LDMOS integrated circuits, for operation in high-radiation environments. The rad-hard transistor devices provided by this invention may also be used in other applications requiring low leakage and high breakdown voltage, while allowing minimum gate-length designs for high speed. Embodiments of the present invention also provide integrated circuits (ICs) that contain these improved radiation hardened transistor devices, including compact combinations of rad-hard or both rad-hard and non-rad-hard transistors suitable for use in either digital or analog circuits with high circuit density. The Hardness-By-Design concepts presented herein can be applied to commercial IC processes and technologies that are not inherently radiation-hard, and the invention provides radiation hardened devices and circuits exhibiting lower Total Ionizing Dose radiation-induced leakage currents while maintaining high breakdown voltages and circuit densities approaching those in non-rad-hard ICs. The present invention also provides semiconductor wafers containing integrated circuit dice that include at least one radiation-hardened NMOS device, as well as variations in which wafers hold a plurality of IC dice having differing levels of radiation tolerance or having differing predetermined tradeoffs between radiation tolerance and performance. According to yet other embodiments of the present invention, methods for fabricating radiation hardened NMOS devices and ICs are provided that accommodate the improved design and layout techniques also provided herein, while supporting advanced IC processes incorporating lightly-doped drain (LDD) and silicidation techniques.

Other applications of these techniques will also be apparent, and therefore the scope of the invention is much broader than the few specific examples described herein. While the present invention has been particularly shown and described in detail with reference to the preferred embodiments thereof, it will be understood by those skilled in the art that various modifications can be made in form and details therein without departing from the spirit and scope of the invention as set forth in the appended claims. The invention should therefore not be limited to the particular implementations discussed herein.

I claim:

1. A method of fabricating a radiation-hardened NMOS device, comprising the steps of:
    providing a silicon substrate having a surface that is lightly doped p-type;
    forming a field oxide in the surface of the substrate, patterned to define an active region having a boundary within which the field oxide is absent, the boundary having a first edge and a second edge opposite the first edge;
    growing a gate oxide in the active region;
    depositing a polysilicon gate layer;
    redoping the polysilicon gate layer N+ using a redope pattern that extends over at least one region from which silicide formation will be excluded using a silicide block pattern;
    patterning and etching the polysilicon gate layer to form a gate crossing the active region in a width direction from the first edge to the second edge, the gate having two sides and having a gate length between the two sides in a length direction orthogonal to the width direction;
    forming an n-type lightly-doped drain structure along at least one side of the gate using an LDD pattern that excludes n-type doping from a gap region, the gap region adjacent the at least one side of the gate and adjacent at least one of the first and second edges and having a gap width g in the width direction;
    patterning and doping n-type source/drain diffusion regions using an NSD pattern that excludes the n-type dopant from the gap region;
    forming a metal silicide on the diffusion regions and the polysilicon gate layer using a silicide block pattern that is shaped in a way that excludes metal silicide from formation in the gap region and on a portion of the gate that was redoped; and
    completing fabrication of the radiation-hardened NMOS device.

2. The method of claim 1, further comprising a step, after the step of forming a field oxide, of forming a moderately-doped p-type band along at least one of the first and second edges under the gate, the band having a length at least as long as the gate length and extending in the width direction into the gap region a nonzero distance g' that is less than the gap width g.

3. The method of claim 1, wherein the substrate further comprises devices other than a radiation-hardened NMOS device, and wherein the step of redoping the polysilicon gate layer uses a pattern that selectively restricts the N+ redoping to regions of the substrate that contain at least one radiation-hardened NMOS device.

4. The method of claim 1, wherein the step of patterning and doping the n-type source/drain diffusion region is performed before the step of forming an n-type lightly-doped drain structure.

5. A method of fabricating a radiation-hardened NMOS device, comprising the steps of:
    providing a silicon substrate having a surface that is lightly doped p-type;
    forming a field oxide in the surface of the substrate, patterned to define an active region having a boundary within which the field oxide is absent and along which the field oxide has an edge, the active region having a total length between two ends in a length direction, and a total width between a first boundary side and a second boundary side in a width direction orthogonal to the length direction;
    growing a gate oxide in the active region;
    depositing a polysilicon gate layer;
    patterning and etching the polysilicon gate layer to form at least one gate having two sidewalls and a gate length between the two sidewalls in the length direction, the at least one gate crossing the total width of the active region and crossing each of the first boundary side and the second boundary side of the active region, a parasitic edge channel formed along the field oxide edge where each gate crosses over each of the first boundary side and the second boundary side, each parasitic edge channel having an edge channel length;
    patterning and doping a partially pulled-back n-type source/drain diffusion region using a pattern that excludes N+ doping from a gap region, wherein a segment of a border of the diffusion region having two segment ends on opposite sides of the gate, the segment crossing the gate proximate a parasitic edge channel, has a length between the two segment ends at least as long as the edge channel length and shorter than the total length of the active region, and wherein at least one of the two segment ends is separated by at least a predetermined nonzero distance from the nearest end of the active region, the segment of the border displaced from the field oxide edge toward the center of the active region along the width direction by a gap width g, and wherein the gap region is bounded by the at least one gate, the active region boundary, and the border of the n-type diffusion region;

forming an n-type lightly-doped drain structure along at least one sidewall of the gate using a pattern that excludes n-type doping from the gap region; and completing fabrication of the radiation-hardened NMOS device.

6. The method of claim 5, wherein the step of forming an n-type lightly-doped drain structure is performed before the step of patterning and doping the n-type source/drain diffusion region.

7. The method of claim 5, further comprising a step, after the step of forming a field oxide, of forming a moderately-doped p-type band along at least one of the first and second edges under the gate, the band having a length at least as long as the gate length and extending in the width direction into the gap region a nonzero distance g' that is less than the gap width g.

8. The method of claim 5, further comprising a step of forming a metal silicide on the diffusion region and the gate polysilicon using a silicide block pattern that excludes silicide from formation in the gap region.

9. The method of claim 8, wherein the silicide block pattern is shaped in a way that excludes metal silicide from formation on at least one region of the polysilicon gate layer in addition to excluding it from the gap region, and further comprising a step, before the step of patterning and etching the polysilicon gate layer, of redoping the polysilicon gate layer N+ in the at least one region from which silicide formation is excluded.

10. The method of claim 9, wherein the substrate further comprises devices other than a radiation-hardened NMOS device, and wherein the step of redoping the polysilicon gate layer uses a pattern that selectively restricts the N+ redoping to regions of the substrate that contain at least one radiation-hardened NMOS device.

11. The method of claim 7, further comprising a step of forming a metal silicide on the diffusion region and the gate polysilicon using a silicide block pattern that excludes silicide from formation in the gap region.

12. The method of claim 11, wherein the silicide block pattern is shaped in a way that excludes metal silicide from formation on at least one region of the polysilicon gate layer in addition to excluding it from the gap region, and further comprising a step, before the step of patterning and etching the polysilicon gate layer, of redoping the polysilicon gate layer N+ in the at least one region from which silicide formation is excluded.

13. The method of claim 12, wherein the substrate further comprises devices other than a radiation-hardened NMOS device, and wherein the step of redoping the polysilicon gate layer uses a pattern that selectively restricts the N+ redoping to regions of the substrate that contain at least one radiation-hardened NMOS device.

14. The method of claim 6, further comprising a step of forming a metal silicide on the diffusion region and the gate polysilicon using a silicide block pattern that excludes silicide from formation in the gap region.

15. The method of claim 14, further comprising a step, after the step of forming a field oxide, of forming a moderately-doped p-type band along at least one of the first and second edges under the gate, the band having a length at least as long as the gate length and extending in the width direction into the gap region a nonzero distance g' that is less than the gap width g.

* * * * *